(12) United States Patent
Yasunami

(10) Patent No.: US 6,270,941 B1
(45) Date of Patent: Aug. 7, 2001

(54) POSITIVE SILICONE-CONTAINING PHOTOSENSITIVE COMPOSITION

(75) Inventor: Shoichiro Yasunami, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/493,285

(22) Filed: Jan. 28, 2000

(30) Foreign Application Priority Data

Jan. 28, 1999 (JP) .................................................. 11-020224
Feb. 9, 1999 (JP) .................................................. 11-031591

(51) Int. Cl.⁷ ................................ G03F 7/004; C08J 3/28
(52) U.S. Cl. ........................................ 430/270.1; 522/148
(58) Field of Search ........................ 430/270.1; 522/148

(56) References Cited

U.S. PATENT DOCUMENTS 5,252,430 * 10/1993 Hashimoto et al. .................. 430/296
5,389,492 *  2/1995 Kokubo et al. ...................... 430/191

* cited by examiner

*Primary Examiner*—Rosemary E. Ashton
(74) *Attorney, Agent, or Firm*—Sughrue, Mion, Zinn, Macpeak & Seas, PLLC

(57) ABSTRACT

Disclosed is a positive silicone-containing photosensitive composition comprising a water-insoluble and alkali-soluble silicon-containing polymer having a specific siloxane structure, a compound which generates an acid upon irradiation with actinic rays or radiation, and a polymer having a repeating unit of a specific structure and showing the enhanced solubility in an alkaline developing solution by the action of an acid.

3 Claims, No Drawings

POSITIVE SILICONE-CONTAINING PHOTOSENSITIVE COMPOSITION

FIELD OF THE INVENTION

The present invention relates to a positive silicone-containing photosensitive composition for exposure by radiation of ultraviolet rays, far ultraviolet rays, X-rays, electron beams, molecular beams, gamma-rays and synchrotron radiation. More specifically, the present invention relates to a positive silicone-containing photosensitive composition for forming fine patterns particularly having high resolution, sensitivity, giving resist of a rectangular cross section, and having broad processing tolerance, which are used for producing, for example, circuit boards, etc., in the producing process of a semiconductor such as IC and the like.

The positive silicone-containing photosensitive composition according to the present invention can be used in the following processes. For example, the positive silicone-containing photosensitive composition according to the present invention is coated on a substrate such as a semiconductor wafer, glass, ceramic or metal, or these substrates having provided thereon a reflection preventing layer or an organic layer in a thickness of from 0.01 to 3 μm by a spin coating method or a roller coating method. Subsequently, the coated layer is heated and dried, and a circuit pattern or other pattern is printed on the layer by, e.g., irradiation which actinic rays through an exposure mask, and then developed to form a positive image. Further, the substrate can be etched with this positive image as the mask to form the pattern on the substrate. Typical applications of the positive silicone-containing photosensitive composition are manufacture of semiconductors such as IC and the like, manufacture of circuit boards for liquid crystals and thermal heads, and other photo fabrication processes.

BACKGROUND OF THE INVENTION

With the higher integration of LSI, it is apparent that conventional monolayer resist systems have already reached the utmost limit of resolution hence a method of forming a high shape ratio having a large layer thickness but a fine pattern has been proposed by employing a multilayer resist system. That is, an organic polymer thick layer is formed as a first layer and a resist thin layer is provided thereon as a second layer, and the second resist material layer is irradiated with high energy radiation to thereby perform development. This method aims at obtaining a pattern having high rectangular property by oxygen plasma etching ($O_2$ RIE) the first organic polymer layer anisotropically using the positive image obtained above as the mask (see Lin, *Solid State Technology*, Vol. 24, p. 73 (1981)).

In this case, the second resist material layer should be highly resistive to $O_2$ RIE hence it is suggested to use a silicon-containing polymer as the second layer.

Further, Bowden et al., reported polytrimethylsilylbutetnyl sulfone (see *Society of Photooptical Instrumentation Engineering Abstract*, 631-01 p. 14 (1986)). However, as these resist materials are low in a silicon content and silicon is introduced into the side chain, the resistance to oxygen plasma is not sufficient and cannot be used as the mask of the etching of the first organic polymer layer. Further, a non-swelling type resist capable of alkali development is necessary for forming a pattern of high resolution.

Various attempts have been done for the development of resists which have oxygen plasma resistance and alkali development suitability, and they have been partly used for g-line exposure (exposure wavelength of 436 nm) or other exposure.

For example, JP-A-1-283555 (the term "JP-A" as used herein means an "unexamined published Japanese patent application"), JP-A-4-36754, JP-A-4-130324 and JP-A-2-29652 can be exemplified. However, a pattern of high resolution and rectangular shape cannot be obtained by these techniques because light absorption of these resists to exposure light is too large for the formation of fine patterns of a line width of 0.3 μm or less with KrF excimer laser beams, etc.

For reducing light absorption to exposure light, solution to the problem has been attempted variously using a small amount of photoacid generator and a compound whose alkali-insoluble group is decomposed by the generated acid and becomes alkali-soluble.

These techniques are disclosed in JP-A-63-218948, JP-A-63-241542, JP-A-4-245248 and JP-A-6-184311, for instance.

However, when these techniques are applied for the formation of ultrafine patterns of a line width of 0.2 μm or less, a rectangular pattern cannot be obtained because the layer thickness extremely decreases after development as even the unexposed area is partly exposed due to the diffraction of light. Further, dimensional fluctuation becomes large in some resists and mask dimension can hardly be reproduced in the pattern transfer to the lower layer in the next oxygen plasma process as the silicon content in the resist is low.

SUMMARY OF THE INVENTION

An object of the present invention is to solve the above-described problems and provide a photosensitive composition having high sensitivity and high resolution in semiconductor device production. Specifically, an object of the present invention is to provide a photosensitive composition which exhibits little light absorption in deep ultraviolet region and can cope with short wavelength light sources.

Another object of the present invention is to provide a positive photosensitive composition which can cope with exposure in a far ultraviolet region and have high sensitivity and high resolution in semiconductor device production.

A further object of the present invention is to provide a positive photosensitive composition which causes little film thickness loss in a fine pattern of a line width of 0.2 μm or less after development process and gives a rectangular resist.

A still further object of the present invention is to provide a positive photosensitive composition which causes less dimensional shift (dimensional fluctuation) in pattern transfer to the lower layer in oxygen plasma process and is excellent in dimensional reproduction.

Other object of the present invention is to provide a positive photosensitive composition having broad processing tolerance.

As a result of extensive investigations by the present inventors taking the above various characteristics into consideration, the present invention has been accomplished. That is, the objects of the present invention can be attained by the following constitutions.

(1) A positive silicone-containing photosensitive composition which comprises:

(a) a water-insoluble and alkali-soluble polymer having a structure represented by the following formula (I) and/or (II)

(I)

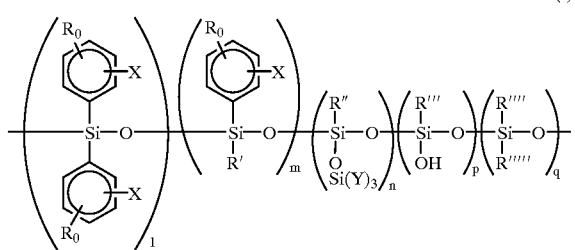

(II)

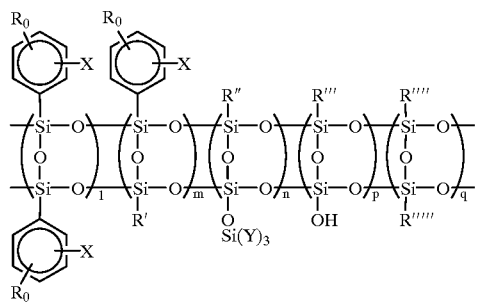

wherein X represents a group selected from the group consisting of a —C(=O)—R group, a —CH(OH)—R group, and a carboxyl group, and a plurality of X's may be the same or different; R represents a hydrogen atom or a hydrocarbon group which may have a substituent; R', R'', R''', R'''' and R''''', which may be the same or different, each represents a group selected from the group consisting of a hydroxyl group, and an alkyl, cycloalkyl, alkoxyl, alkenyl, aralkyl and phenyl groups each of which may have a substituent; Y represents an alkyl group, an alkoxyl group or a siloxyl group; $R_0$ represents a group selected from the group consisting of a hydrogen atom, a halogen atom, a substituted or unsubstituted aliphatic hydrocarbon group and a substituted or unsubstituted aromatic hydrocarbon group; l, m, n and q each represents 0 or a positive integer; and p represents a positive integer;

(b) a compound which generates an acid upon irradiation with actinic rays or radiation, and (c) a polymer which has a repeating unit containing a group represented by formula (III), (IV) or (V) at the side chain, and shows the enhanced solubility in an alkaline developing solution by the action of an acid:

(III)

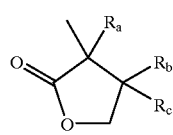

(IV)

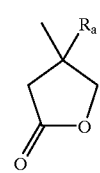

(V)

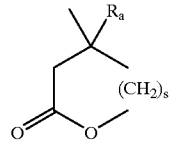

wherein $R_a$, $R_b$, and $R_c$ each represents a hydrogen atom, or a hydrocarbon group which may have a substituent; and s represents an integer of 2 or more.

(2) A positive silicon-containing photosensitive composition which comprises:

(a) a water-insoluble and alkali-soluble polymer having a structure represented by the following formula (I) and/or (II) as described in the above item (1), (b) a compound which generates an acid upon irradiation with actinic rays or radiation, and (d) a polymer which has a repeating unit containing a polycyclic structure at the side chain, and shows the enhanced solubility in an alkaline developing solution by the action of an acid.

(3) A positive silicone-containing photosensitive composition which comprises:

(a) a water-insoluble and alkali-soluble polymer having a structure represented by the above formula (I) and/or (II), (b) a compound which generates an acid upon irradiation with actinic rays or radiation, and (e) a polymer which has a repeating unit containing a group represented by the above formula (III), (IV) or (V) at the side chain and a repeating unit containing a polycyclic structure at the side chain, and shows the enhanced solubility in an alkaline developing solution by the action of an acid.

(4) A positive silicone-containing photosensitive composition which comprises:

(a) a water-insoluble and alkali-soluble polymer having a structure represented by the above formula (I) and/or (II), (b) a compound which generates an acid upon irradiation with actinic rays or radiation, and (f) a polymer which has a repeating unit represented by the following formula (X), contains an acid-decomposable group, and shows the enhanced solubility in an alkaline developing solution by the action of an acid:

(X)

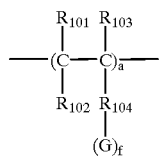 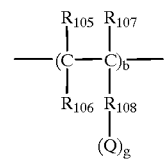

wherein $R_{101}$ to $R_{103}$, $R_{105}$ to $R_{107}$, which may be the same or different, each represents a hydrogen atom, a halogen atom, a group represented by formula —C(=O)—Z—$R_{113}$, an alkyl, aralkyl or alkoxyl group each of which may have a substituent, where Z represents a single bond, —O—, —NH— or —N($R_{125}$)—, $R_{113}$ and $R_{125}$, which may be the same or different, each represents an alkyl, cycloalkyl or aralkyl group each of which may have a substituent; $R_{104}$ and $R_{108}$, which may be the same or different, each represents a divalent to pentavalent group represented by the following formula:

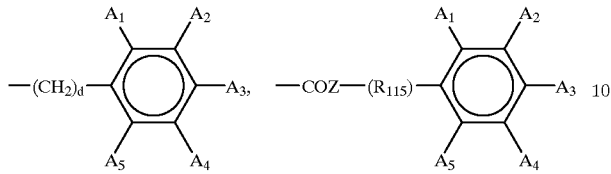

wherein $A_1$ to $A_5$, which may be the same or different, each represents a hydrogen atom, —$R_{114}$, or a single bond, and at least one of $A_1$ to $A_5$ represents a single bond; $R_{115}$ represents a single bond or a group represented by formula —$R_{130}$—$Y_3$—; Z represents a single bond or a group represented by —O—, —NH— or —$NR_{125}$—; d represents an integer of 0 or more; $R_{114}$ has the same meaning as the above-described $R_{101}$ to $R_{103}$ and $R_{105}$ to $R_{107}$; $R_{130}$ represents an alkylene or cycloalkylene group each of which may have a substituent; $Y_3$ represents a single bond, —S—, —O—, or —OC(=O)—; and $R_{125}$ has the same meaning as above;

$R_{102}$ and $R_{104}$, and $R_{106}$ and $R_{108}$ may be bonded to each other to form the following group:

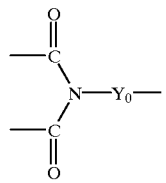

wherein $Y_0$ has the same meaning as the above $R_{104}$ and $R_{108}$; and $Y_0$ is bonded to G or Q;

G represents a group selected from the group consisting of —OH, —COOH, —CONHCOR$_{116}$, —CONHSO$_2$—R$_{116}$, and —SO$_2$—NH—R$_{116}$, where R$_{116}$ represents an alkyl, cycloalkyl, acyl, or aryl group each of which may have a substituent;

Q represents a group represented by any of the following formulae:

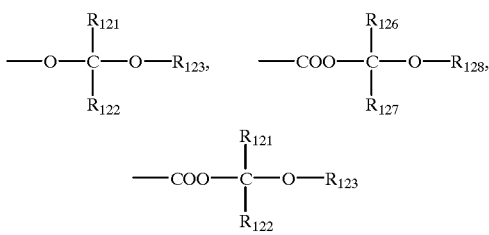

wherein $R_{121}$ and $R_{122}$, which may be the same or different, each represents a hydrogen atom, or an alkyl group having from 1 to 4 carbon atoms which may be substituted with a halogen atom; $R_{123}$ represents an alkyl, cycloalkyl, aryl or aralkyl group each of which may have a substituent; $R_{126}$ and $R_{127}$, which may be the same or different, each has the same meaning as $R_{121}$ and $R_{122}$; and $R_{128}$ represents an alkyl, cycloalkyl, aryl or aralkyl group each of which may have a substituent;

a represents an integer of 0 or more; b represents a positive integer; and f and g each represents an integer of from 1 to 4.

DETAILED DESCRIPTION OF THE INVENTION

The embodiments of the present invention will be described below, but the present invention should not be construed as being limited thereto.

The positive silicone-containing photosensitive composition according to the present invention comprises a polymer of component (a), a compound of component (b) and at least one polymer of components (c) to (f).

A polymer of component (a) can be synthesized by those skilled in the art by referring to the synthesis methods disclosed, for example, in JP-A-1-283555, JP-A-63-241542 and JP-A-4-36754.

For highly achieving the objects of the present invention, the silicon content in component (a) is preferably high, specifically it is preferably contained in an amount of from 3 to 50 wt % in component (a) polymer, and more preferably from 5 to 35 wt %. In this point of view, a polymer having the structure represented by formula (II) as the main structure is more preferred of components (a).

Examples of the hydrocarbon groups represented by R include a methyl group, an ethyl group and a butyl group. X preferably represents an acetyl group.

Examples of the alkyl groups represented by R', R", R''', R'''' and P''''' include a methyl group, an ethyl group, a propyl group, a butyl group, a chloromethyl group, and a bromomethyl group. Examples of the cycloalkyl groups represented by R' to R'''' include a cyclopentyl group, a cyclohexyl group, a norbornyl group, an adamantyl group, and a p-isopropylcyclohexyl group. Examples of the alkenyl groups represented by R' to R'''' include an allyl group, an isopropenyl group and a butenyl group. Examples of the aralkyl groups represented by R' to R'''' include a benzyl group, a phenethyl group, and a naphthylethyl group. Examples of the alkoxyl groups represented by R' to R'''' include a methoxy group, an ethoxy group and a propoxy group.

R' to R'''' each preferably represents a methyl group, a cyclohexyl group, a methoxy group, or an ethoxy group.

Examples of the alkyl groups represented by Y include a methyl group, an ethyl group, a propyl group, and a chloromethyl group. Examples of the alkoxyl groups represented by Y include a methoxy group, an ethoxy group and a propoxy group. Examples of the siloxyl groups represented by Y include a trimethylsiloxyl group and a triethoxysiloxyl group. Y preferably represents, e.g., a methyl group or a methoxy group.

Examples of the aliphatic hydrocarbon groups represented by $R_0$ include an alkyl group, an alkoxyl group, an alkenyl group, an alkoxycarbonyl group, an acyloxy group, and an acyl group. Examples of the alkyl groups include a methyl group, an ethyl group, a propyl group, an isopropyl group, a butyl group, and an octyl group. Examples of the akioxyl groups or the alkoxyl groups of the alkoxycarbonyl group include a methoxy group, an ethoxy group, a propoxy group, and an isopropoxy group. Examples of the acyl groups include a formyl group, an acetyl group, an ethylcarbonyl group, and a propylcarbonyl group. Examples of the alkenyl groups include an allyl group, an isopropenyl group and a butenyl group. Examples of the acyloxy groups include a formyloxy group, an acetoxy group, a propionyloxy group, a methacryloyloxy group, an acryloyloxy group, and a crotonoyloxy group. Examples of the aromatic hydrocarbon groups include a phenyl group, a benzyl group and a phenethyl group.

$R_0$ preferably represents a hydrogen atom, an alkyl, alkoxyl or acyl group each having from 1 to 6 carbon atoms, more preferably represents a hydrogen atom or an alkyl group having from 1 to 6 carbon atoms.

The hydrocarbon group represented by R, and the alkyl, cycloalkyl, alkenyl, aralkyl and phenyl groups represented by R' to R"'' may further have a substituent. Examples of the substituents include a halogen atom, e.g., Cl, Br and F, a —CN group, an —OH group, an alkyl group having from 1 to 4 carbon atoms, a cycloalkyl group having from 3 to 8 carbon atoms, an alkoxyl group having from 1 to 4 carbon atoms, an acyl group having from 1 to 4 carbon atoms, an acylamino group, a furyl group, a furfuryl group, a pyranyl group, an aralkyl group, an allyloxyalkyl group, and a silyl group. Examples of the aralkyl group include a benzyl group and a phenethyl group. Examples of the allyloxyalkyl group include aphenoxyethyl group. Examples of the silyl group include a trimethylsilyl group and a trimethoxysilyl group. Of these, a halogen atom, a —CN group, an alkoxyl group, an alkyl group and a silyl group are preferred in view of the easiness of synthesis.

With respect to l, m, n, p and q, the following conditions are preferred:

l/l+m+n+p+q=from 0.05 to 0,95,
m/l+m+n+p+q=from 0 to 0.95,
n/l+m+n+p+q=from 0 to 0.95,
p/l+m+n+p+q=from 0.02 to 0.5,
q/l+m+n+p+q=from 0 to 0.95, and the following conditions are more preferred:

l/l+m+n+p+q=from 0.2 to 0.9,
m/l+m+n+p+q=from 0 to 0.7.
n/l+m+n+p+q=from 0 to 0.5,
p/l+m+n+p+q=from 0.05 to 0.3,
q/l+m+n+p+q=from 0 to 0.7.

The weight-average molecular weight of component (a) polymer is not particularly restricted, but it is preferably from 400 to 50,000 in light of the miscibility with component (c) polymer and the solubility in an organic solvent, more preferably from 800 to 10,000, and particularly preferably from 1,000 to 8,000. The weight-average molecular weight is a polystyrene calculated value in gel permeation chromatography.

Component (b) for use in the present invention is a compound which is decomposed by the irradiation with actinic rays or radiation and generates an acid. Such a compound which is used in the present invention as component (b) can be appropriately selected from photocationic polymerization photoinitiators, photoradical polymerization photoinitiators, photo-decoloring agents and photo-discoloring agents of dyes, and compounds which generate acid by the irradiation with well-known rays used in microresists, etc., and mixtures of these compounds.

The following compounds can be exemplified as the compound which is decomposed by the irradiation with actinic rays or radiation and generates an acid, for example, diazonium salts described in S. I. Schlesinger, *Photogr. Sci. Eng.*, 18, 387 (1974), and T. S. Bal et al., *Polymer*, 21, 423 (1980); ammonium salts described in U.S. Pat. Nos. 4,069, 055, 4,069,056, and Re 27,992, and JP-A-3-140140; phosphoniuim salts described in D. C. Necker et al., *Macromolecules*, 17, 2468 (1984), C. S. Wen et al., *Teh, Proc. Conf. Rad. Curing ASIA*, p. 478, Tokyo, Octuber (1988), U.S. Pat. No. 4,069,055 and U.S. Pat. No. 4,069,056; iodonium salts described in J. V. Crivello et al., *Macromolecules*, 10 (6), 1307 (1977), *Chem. & Eng. News*, Nov. 28, p. 31 (1988), European Patents 104143, 339049, 410201, JP-A-2-150848, and JP-A-2-296514; sulfonium salts described in J. V. Crivello et al., *Polymer J.*, 17, 73 (1985), J. V. Crivello et al., *J. Org. Chem.*, 43, 3055 (1978), W. R. Watt et al., *J. Polymer Sci.*, Polymer Chem. Ed., 22, 1789 (1984), J. V. Crivello et al., *Polymer Bull.*, 14, 279 (1985), J. V. Crivello et al., *Macromolecules*, 14 (5), 1141 (1981), J. V. Crivello et al., *J Polmer Sci.*, Polymer Chem. Ed., 17, 2877 (1979), European Patents 370693, 161811, 410201, 339049, 233567, 297443, 297442, U.S. Pat. Nos. 4,933,377, 3,902,114, 4,760,013, 4,734,444, 2,833,827, German Patents 2,904,626, 3,604,580, and 3,604,581; selenonium salts described in J. V. Crivello et al., *Macromolecules*, 10 (6), 1307 (1977), and J. V. Crivello et al., *J. Polymer Sci.*, Polymer Chem. Ed., 17, 1047 (1979); onium salts, such as arsonium salts, etc., described in C. S. Wen et al., *Teh, Proc. Conf. Rad. Curing ASIA*, p. 478, Tokyo, October (1988); organic halogen compounds describedin U.S. Pat. No. 3,905,815, JP-B-46-4605 (the term "JP-B" as used herein means an "examined Japanese patent publication") JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; organic metal/organic halogen compounds described in K. Meier et al., *J. Rad. Curing*, 13 (4), 26 (1986), T. P. Gill et al., *Inorg. Chemi*, 19, 3007 (1980), D. Astruc, *Acc. Chem. Res.*, 19 (12), 377 (1896), and JP-A-2-161445; photoacid generators having an o-nitrobenzyl protective group described in S. Hayase et al., *J. Polymer Sci.*, 25, 753 (1987), E. Reichmanis et al., *J. Polymer Sci.*, Polymer Chem. Ed., 23, 1 (1985), Q. Q. Zhu et al., *J. Potochem.*, 36, 85, 39, 317 (1987), B. Amit et al., *Tetrahedron Lett.*, (24) 2205 (1973), D. H. R. Barton et al., *J. Chem. Soc.*, 3571 (1965), P. M. Collins et al., *J. Chem. Soc.*, Perkin I, 1695 (1975), M. Rudinsein et al., *Tetrahedron Lett.*, (17), 1445 (1975), J. W. Walker et al., *J. Am Chem, Soc.*, 110, 7170 (1988), S. C. Busman et al *J. Imaging Technol.*, 11 (4), 191 (1985), H. M. Houlihan et al., *Macromolecules.*, 21, 2001 (1988), P. M. Collins et al., *J. Chem. Soc.*, Chem. Commun., 532 (1972), S. Hayase et al., *Macromolecules*, 18, 1799 (1985), E. Reichmanis et al., *J. Electrochem. Soc.*, Solid Stare Sci. Technol., 130 (6), F. M. Houlihan et al., *Macromolecules*, 21, 2001 (1988), European Patents 0290750, 046083, 156535, 271851, 0388343, U.S. Pat. Nos. 3,901,710, 4,181,531, JP-A-60-198538, and JP-A-53-133022; compounds which generate a suifonic acid by photodecomposition represented by iminosulfonate described in M. Tunooka et al., *Polymer Preprints, Japan*, 35 (8), G. Berner et al., *J. Rad. Curing*, 13 (4), W. J. Mijs et al., *Coating Technol.*, 55 (697), 45 (1983), Akzo, H. Adachi et al., *Polymer Preprints, Japan*, 37 (3), European Patents 0199672, 84515, 044115, 618564, 0101122, U.S. Pat. Nos. 4,371,605, 4,431,774, JP-A-64-18143, JP-A-2-245756, and JP-A-3-140109; and disulfone compounds described in JP-A-61-166544.

Further, compounds having introduced these groups or compounds generating an acid by irradiation with light into the polymer main chain or side chain can be used in the present invention, e.g., compounds described in M. E. Woodhouse et al., *J.Am. Chem. Soc.*, 104, 5586 (1982), S. P.

Pappas et al., *J. Imaging Sci*, 30 (5), 218 (1986), S. Kondo et al., *Makromol, Chem.*, Rapid Commun., 9, 625 (1988), Y. Yamada et al., *Makromol. Chem.*, 152, 153, 163 (1972), J. V. Crivello et al., *J. Polymer Sci.*, Polymer Chem. Ed., 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, andJP-A-63-146029. Further, the compounds which generate an acid by irradiation with light as described, e.g., in V. N. R. Pillai, *Synthesis*, (1), 1 (1980), A. Abad et al. , *Tetrahedron Lett.*, (47) 4555(1971), D. H. R. Barton et al., *J. Chem. Soc.*, (C), 329 (1970), U.S. Pat. No. 3,779,778 and European Patent 126712 can also be used in the present invention.

Of these compounds, from the viewpoint of the acid generation efficiencvby exposure, the suitable diffusion of acid, and the stability in resists, diazodisulfone compounds, salts of substituted or unsubstituted diaryliodonium or triarylsulfonium, in particular, substituted or unsubstituted arylsulfonate and camphorsulfonate are preferred.

Polymers of components (c) to (e) are described below.

Each of polymers of components (c) to (e) has a repeating unit containing at least one group represented by formula (III) (IV) or (V) at the side chain.

In formulae (III), (IV) and (V), $R_a$, $R_b$ and $R_c$ each represents a hydrogen atom or a hydrocarbon group. Examples of the hydrocarbon groups include an alkyl group having from 1 to 8 carbon atoms, a cycloalkyl group having from 4 to 10 carbon atoms, and an aralkyl group having from 7 to 12 carbon atoms. Examples of the alkyl groups include a methyl group, an ethyl group, a propyl group, an isopropyl group, a butyl group, and an octyl group. Examples of cycloalkyl groups include a cyclopentyl group, a cyclohexyl group, and a cycloheptyl group. Examples of the aralkyl groups include a benzyl group, a phenethyl group and a naphthylethyl group.

When $R_a$, $R_b$ and $R_c$ each represents an alkyl group, a cycloalkyl group, or an aralkyl group, each of these groups may further have a substituent. Examples of the substituens include a halogen atom, e.g., Cl, Br and E, a —CN group, an —OH group, an alkyl group having from 1 to 4 carbon atoms, a cycloalkyl group having from 3 to 8 carbon atoms, an alkoxyl group having from 1 to 4 carbon atoms, an acylamino group such as an acetylamino group, an aralkyl group such as a benzyl group and a phenethyl group, an allyloxyalkyl group such as a phenoxyethyl group, and a silyl group such as a trimethylsilyl group and a trimethoxysilyl group. However, the substituents are not limited thereto.

In light of the miscibility with component (a) polymer, developing solution suitability and high achievement of the objects of the present inventon, $R_a$, $R_b$ and $R_c$ in formulae (III) (IV) and (V) each preferably represents a hydrogen atom, an alkyl group having from 1 to 8 carbon atoms which may have a substituent, or an aralkyl group having from 7 to 12 carbon atoms which may have a substituent, more preferably each represents a hydrogen atom or an alkyl group having from 1 to 4 carbon atoms which may have a substituent, and particularly preferably each represents a hydrogen atom, a methyl group or an ethyl group.

s preferably represents an integer of from 2 to 6, more preferably from 2 to 4, and particularly preferably 2.

The repeating unit containing a group represented by formula (III), (IV) or (V) at the side chain is specifically represented by the following formula (VI):

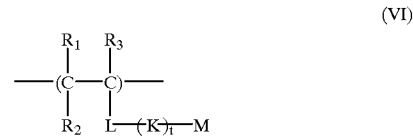

wherein $R_1$, $R_2$ and $R_3$ each represents a hydrogen atom, an alkyl group which may have a substituent, a halogen atom, a cyano group, or a —C(=O)—Z—$R_4$ group; Z represents a single bond, a group represented by —O—, or —N(—$R_5$)—; and $R_4$ and $R_5$ each represents a hydrogen atom, an alkyl or aralkyl group each of which may have a substituent. Examples of the substituents of the alkyl group and the aralkyl group represented by $R_1$ to $R_5$ are the same as the substituents described in the above $R_a$, $R_b$ and $R_c$.

L represents a single bond, a group represented by —C(=O)O— or —C(=O)—N ($R_6$)—; and $R_6$ has the same meaning as $R_5$.

K represents an alkylene or aralkylene group which may have a substituent. Examples of the substituents of these groups are the same as the substituents described in $R_a$, $R_b$ and $R_c$.

t represents 0 or 1.

M represents anv group represented by formula (III), (IV) or (V).

$R_4$ preferably represents an alkyl group having from 1 to 4 carbon atoms which may have a substituent, and a methyl group and an ethyl group are particularly preferred.

$R_5$ preferably represents a hydrogen atom or an alkyl group having from 1 to 4 carbon atoms which may have a substituent, and a hydrogen atom, a methyl group and an ethyl group are particularly preferred.

$R_1$, $R_2$ and $R_3$ each preferably represents a hydrogen atom, an alkyyl group having from 1 to 4 carbon atoms which may have a substituent, or a halogen atom, and particularly preferably each represents a hydrogen atom or a methyl group.

L preferably represents a group represented by —C(=O) O—, —C(=O)—NH—, or —C—N($CH_3$—, and particularly preferably represents a group represented by —C(=C) O—.

K preferably represents an alkylene group having from 1 to 8 carbon atoms which may have a substituent or an aralkylene group having from7 to 12 carbon atoms which may have a substituent, more preferably an alkylene group having from 1 to 6 carbon atoms which may have a substituent, and K particularly preferably represents amethylene group, an ethylene group, apropylene group, a —$CH_2$CH(CH)— group, a —C($CH_3$)$_2$— group, a butylene group, a —CH($CH_3$)$CH_2CH_2$— group, a —$CH_2$CH($CH_3$) $CH_2$— group, a —C($CH_3$)$CH_2$— group, a —$CH_2$C($CH_3$)$_2$— group, or a —CH($CH_3$)—CH($CH_3$)— group.

A polymer of component (d) or (e) has a repeating unit containing a polycyclic structure at the side chain.

The repeating unit containing a polycyclic structure at the side chain is specifically represented by the following formula (VII)

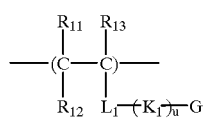

(VII)

wherein $R_{11}$, $R_{12}$ and $R_{13}$ each has the same meaning as $R_1$, $R_2$ and $R_3$ in formula (VI).

$L_1$ has the same meaning as L in formula (VI).

$K_1$ has the same meaning as K in formula (VI).

u has the same meaning as t in formula (VI).

G represents a monovalent polycyclic group. G preferably represents an alicyclic polycyclic group having from 5 to 30 carbon atoms which may have a substituent, more preferably an alicyclic polycyclic group having from 6 to 25 carbon atoms which may have a substituent, and specifically the following compounds can be exemplified. The substituents described above in $R_a$, $R_b$ and $R_c$ in formulae (III), (IV) and (V) can be exemplified as the substituents of these groups.

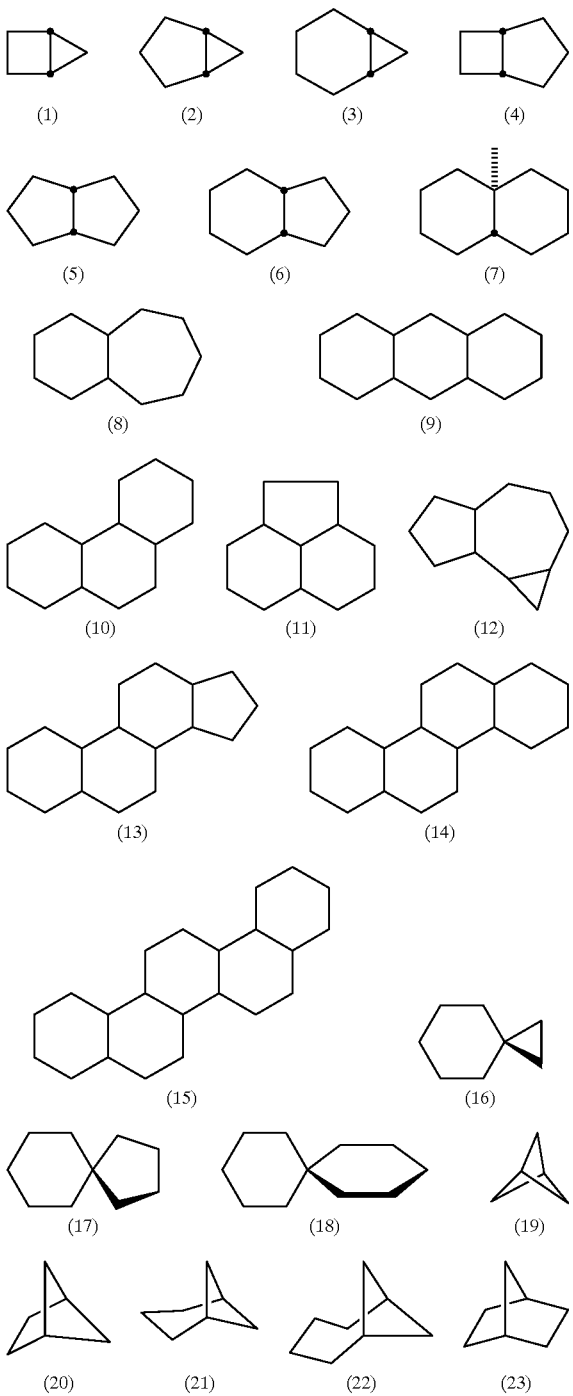

-continued

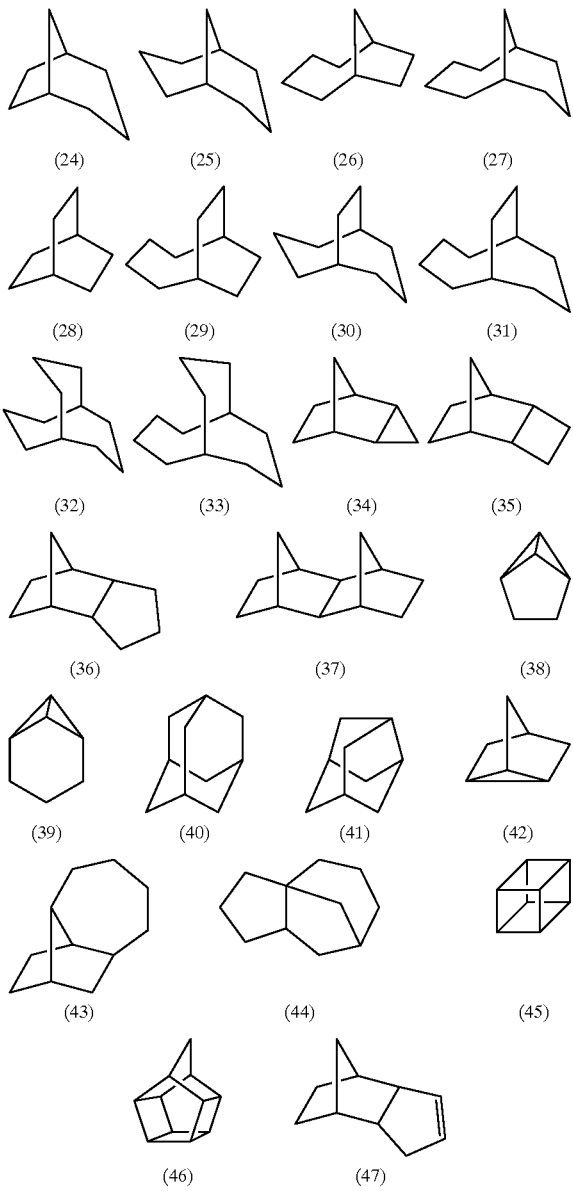

Of the above compounds, compounds (5), (6), (7), (9), (10), (13), (14), (15), (23), (28), (36), (37), (40), (42) and (47) are particularly preferred as G.

The polycyclic group represented by G is linked with $K_1$ or $L_1$ at an arbitrary part.

A polymer for use in the present invention which shows the enhanced solubility in an alkaline developing solution by the action of an acid has a repeating unit containing a group represented by formula (III), (IV) or (V) at the side chain and/or a repeating unit containing a polycyclic group at the side chain (preferably a repeating unit represented by formula (VI) and/or formula (VII)), and the polymer may further have a repeating unit containing other acid-decomposable group at the side chain for the purpose of further improving acid decomposing property. A repeating unit containing other acid-decomposable group at the side chain is specifically represented by the following formula (VIII):

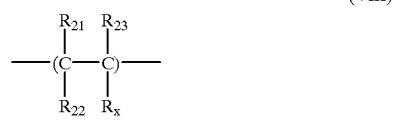

(VIII)

wherein $R_{21}$, $R_{22}$ and $R_{23}$ each has the same meaning as $R_1$, $R_2$ and $R_3$ in formula (VI).

$R_x$ represents a group containing an acid-decomposable group, and is specifically represented by —C(=O)—O—A or —Ar—O—B, wherein A represents a —C($R_{31}$)($R_{32}$) ($R_{33}$) group, an —Si ($R_{31}$)($R_{32}$)($R_{33}$) group, or a —C($R_{34}$) ($R_{35}$) —O—$R_{36}$ group. $R_{31}$ to $R_{35}$, which may be the same or different, each represents a hydrogen atom, an alkyl, cycloalkyl, alkenyl, aralkyl or aryl group each of which may have a substituent; $R_{36}$ represents an alkyl, cycloalkyl or aryl group each of which may have a substituent, provided that at least two of $R_{31}$ to $R_{33}$ are groups other than a hydrogen atom, and at least two of $R_{31}$ to $R_{33}$ and $R_{34}$ to $R_{36}$ may be bonded to form a ring. The substituents of these groups are the same as the substituents described in $R_a$, $R_b$ and $R_c$ in formulae (III), (IV) and (V).

$R_{31}$ to $R_{35}$ each preferably represents a hydrogen atom, an alkyl group having from 1 to 4 carbon atoms (e.g., methyl, ethyl, propyl, isopropyl, butyl, t-butyl), a cycloalkyl group having from 4 to 8 carbon atoms (e.g., cyclopentyl, cyclohexyl, cyclooctyl, adamantyl), an alkenyl group having from 2 to 4 carbon atoms (e.g., vinyl, propenyl, allyl), an aralkyl group having from 7 to 14 carbon atoms (e.g., benzyl, phenethyl), or an aryl group having from 6 to 12 carbon atoms (e.g., phenyl, toluyl, xylyl).

$R_{36}$ preferably represents an alkyl group having from 1 to 6 carbon atoms, a cycloalkyl group having from 4 to 12 carbon atoms, or an aryl group having from 6 to 12 carbon atoms each of which may have a substituent, more, preferably an alkyl group having from 1 to 4 carbon atoms (e.g., methyl, ethyl, propyl, isopropyl, butyl, sec-butyl, isobuty i, t-butyl), a cycloalkyl group having from 5 to 10 carbon atoms (e.g., cyclopentyl, cyclohexyl, cyclooctyl, adamantyl), or an aryl group having from 6 to 10 carbon atoms (e.g., phenyl, toluyl xylyl, t-butylphenyl, isopropylphenyl).

Ar represents divalent or higher monocyclic or polycyclic aromatic group which may have a substituent. The substituents described above in $R_a$, $R_b$ and $R_c$ in formulae (III), (IV) and (V) can be exemplified as the substituents of Ar. Ar preferably represents a phenylene group which may have a substituent.

B represents A or a —C(=O)—O—A group.

In component (c) polmer in the present invention, the case where a group represented by formula (III), (IV) or (V) and/or a polycyclic group also function(s) as an acid-decomposable group is preferred.

In component (c) polymer for use in the present invention, a repeating unit containing a group represented by formula (III), (IV) or (V) at the side chain (preferably a repeating unit represented by formula (VI)) is preferably contained in an amount of from 10 to 100 mol %, more preferably from 20 to 90 mol %, and particularly preferably from 25 to 80 mol %.

In component (d) polymer for use in the present invention, a repeating unit containing a polycyclic group at the side chain (preferably a repeating unit represented by formula (VII)) is preferably contained in an amount of from 10 to 100 mol %, more preferably from 20 to 90 mol %, and particularly preferably from 25 to 80 mol %.

In component (e) polymer for use in the present invention, a repeating unit containing a group represented by formula (III), (IV) or (V) at the side chain and a repeating unit containing a polycyclic group at the side chain (preferably a repeating unit represented by formula (VI) and a repeating unit represented by formula (VII)) are preferably contained in an amount of from 10 to 100 mol % in total, more preferably from 20 to 100 mol %, and particularly preferably from 25 to 100 mol %. The molar ratio of a repeating unit containing a group represented by formula (III), (IV) or (V) at the side chain to a repeating unit containing a polycyclic group at the side chain (preferably a repeating unit represented by formula (VI) to a repeating unit represented by formula (VII)) is from 15/85 to 85/15, preferably from 20/80 to 80/20, and particularly preferably from 25/75 to 75/25.

In polymers of components (c) to (e) for use in the present invention, a repeating unit containing an acid-decomposable group is preferably contained in an amount of from 10 to 100 mol %, more preferably from 20 to 100 mol %, and particularly preferably from 30 to 100 mol %.

Two or more kinds of a repeating unit containing a group represented by formula (III), (IV) or (V) at the side chain (preferably a repeating unit represented by formula (VI)) may be contained in component (c) polymer. Two or more kinds of a repeating unit containing a polycyclic group at the side chain (preferably a repeating unit represented by formula (VII)) may be contained in component (d) polymer. Two or more kinds of each repeating unit of a repeating unit containing a group represented by formula (III), (IV) or (V) at the side chain and a repeating unit containing a polycyclic group at the side chain (preferably a repeating unit represented by formula (VI) and a repeating unit represented by formula (VII)) may be contained in component (e) polymer.

Each polymer of component (c), component (d) and component (e) contains a repeating unit containing a group represented by formula (III), (IV) or (V) at the side chain, a repeating unit containing a polycyclic group at the side chain, and both repeating units respectively, but in addition to these repeating units, other repeating units may be used as copolymers for the purpose of improving film property, adhesion and development property. As such copolymers corresponding to repeating units, compounds containing one addition polymerizable unsaturated bond selected from, e.g., styrenes, acrylic esters, methacrylic esters, acrylamides, methacrylamides, allyl compounds, vinyl ethers, vinyl esters and the like can be exemplified.

Specific examples include styrenes (e.g., styrene, p-hydroxystyrene, methylstyrene, methoxystyrene), acrylic esters, e.g., alkyl acrylate (carbon atom number of the alkyl group is preferably from 1 to 10)(e.g., methyl acrylate, ethyl acrylate, propyl acrylate, amyl acrylate, cyclohexyl acrylate, ethylhexyl acrylate, octyl acrylate, t-octyl acrylate, chloroethyl acrylate, 2-hydroxyethyl acrylate, 2,2-dimethylhydroxypropyl acrylate, 5-hydroxypentyl acrylate, trimethylolpropane monoacrylate, pentaerythritol monoacrylate, benzyl acrylate, methoxybenzyl acrylate, furfuryl acrylate, tetrahydrofurfuryl acrylate, etc.); methacrylic esters, e.g., alkyl methacrylate (carbon atom number of the alkyl group is preferably from 1 to 10)(e.g., methyl methacrylate, ethyl methacrylate, propylmethacrylate, isopropyl methacrylate, amyl methacrylate, hexyl methacrylate, cyclohexyl methacrylate, benzyl methacrylate, chlorobenzyl methacrylate, octyl methacrylate, 2-hydroxyethyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, furfuryl-methacrylate, tetrahydrofurfuryl methacrylate, etc.); acrylamides, e.g., acrylamide, N-alkylacrylamide (carbon atom number of the alkyl group is from 1 to 10, e.g., a methyl group, an ethyl group, a propyl group, a butyl group, a t-butyl group, a heptyl group, an octyl group, a cyclohexyl group, a hydroxyethyl group, etc.), N,N-dialkylacrylamide (carbon atom number of the alkyl group is from 1 to 10, e.g., a methyl group, an ethyl group, a butyl group, an isobutyl group, an ethylhexyl group, a cyclohexyl group, etc.), N-hydroxyethyl-N-methylacryiamide, N-2-acetamidoethyl-N-acetylacrylamide, etc.; methacrylamides, e.g., methacrylamide, N-alkylmethacrylamide (carbon atom number of the alkyl group is from 1 to 10, e.g., a methyl group, an ethyl group, a t-butyl group, an ethylhexyl group, a hydroxyethyl group, a cyclohexyl, etc.), N,N-dialkylmethacrylamide (as the alkyl group, an ethyl group, a propyl group, a butyl group, etc., may be used), N-hydroxyethyl-N-methylmethacrylamide, etc.; allyl compounds, e.g., allyl esters (e.g., allylacetate, allylcaproate, allyicaprylate, allyllaurate, allylpalmitate, allylstearate, allylbenzoate, allylacetoacetate, allyllactate, etc.), allyloxyethanol, etc.; vinyl ethers, e.g., alkyl vinyl ether (e.g., hexyl vinyl ether, octyl vinyl ether, decyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, etc.); vinyl esters, e.g., vinyl butyrate, vinyl isobutylate, vinyl trimethyl acetate, vinyl diethyl acetate, vinyl valerate, vinyl caproate, vinyl chloroacetate, vinyl dichloroacetate, vinyl methoxy acetate, vinyl butoxy acetate, vinyl acetoacetate, vinyl lactate, vinyl-β-phenylbutyrate, vinyl cyclohexylcarboxylate, etc.; dialkyl itaconates (e.g., dimethyl itaconate, diethyl itaconate, dibutyl itaconate, etc.); diahkyl esters of fumaric acid (e.g., dibutyl fumarate, etc.) or monoalkyl esters; acrylic acid, methacrylic acid, crotonic acid, itaconic acid, maleic anhydride, maleimide, acrylonitrile, methacrylonitrile, and maleylonitrile.

Besides the above compounds, addition polymerizable unsaturated compounds copolymerizable with the above various repeating units can be used.

The molar ratio of the content of each repeating unit can be arbitrarily set for controlling the dry etching resistance of the resist, standard developing solution suitability, the adhesion with the substrate, resist profiling, and the general requisite of the resist, i.e., resolution, heat resistance and sensitivity.

Specific examples of the polymers of component (c), component (d) and component (e) for use in the present invention are shown below, but the present invention is not limited thereto.

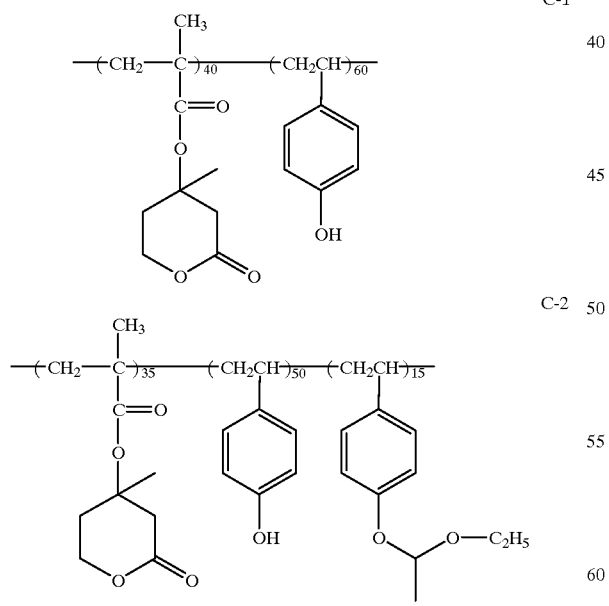

C-1

C-2

-continued

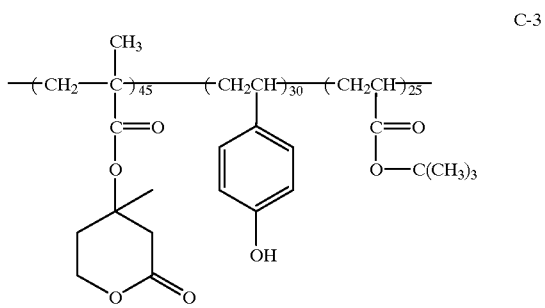

C-3

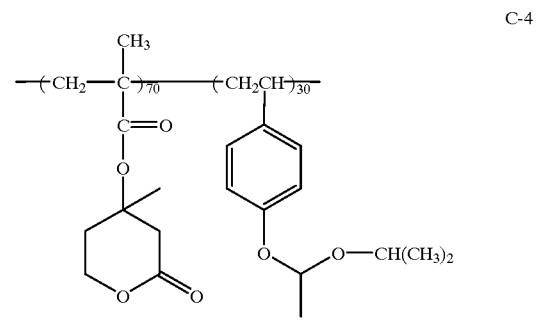

C-4

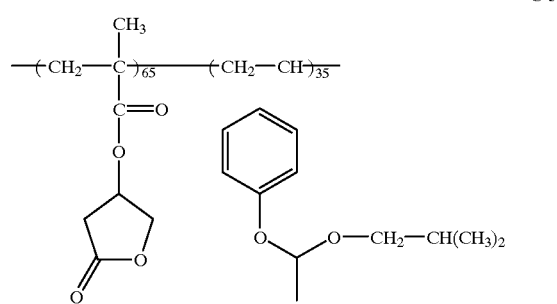

C-5

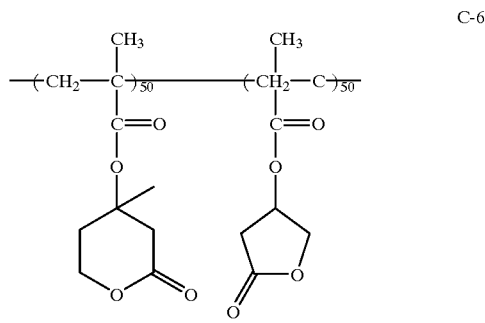

C-6

-continued
C-7
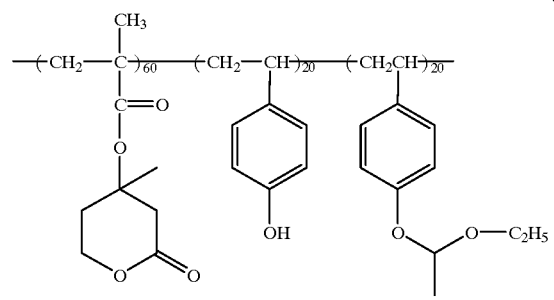
C-8
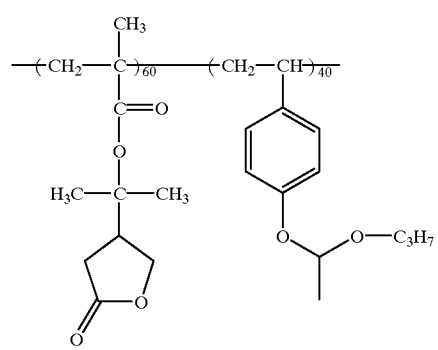
C-9
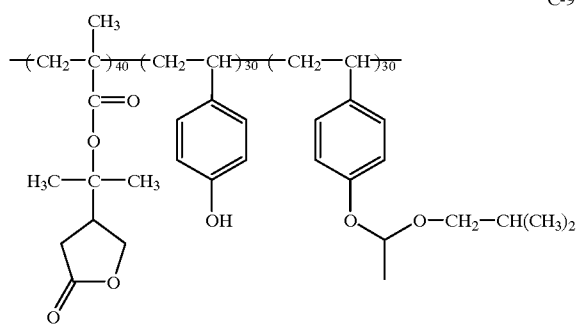
C-10
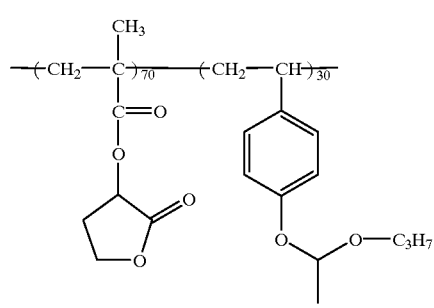
C-11
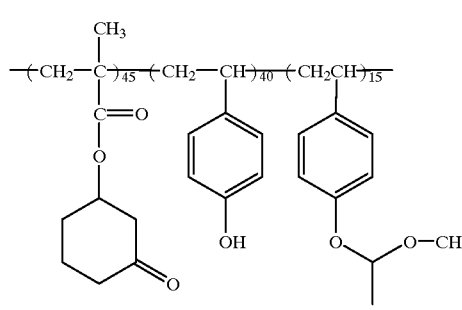
-continued
C-12
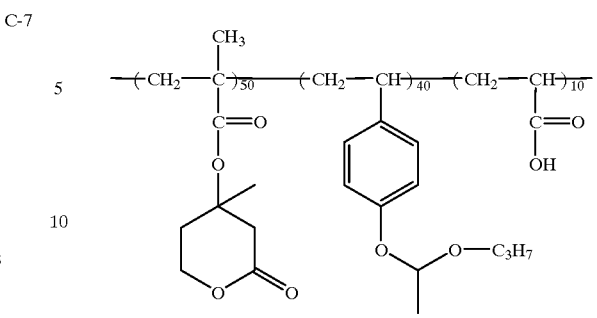
D-1
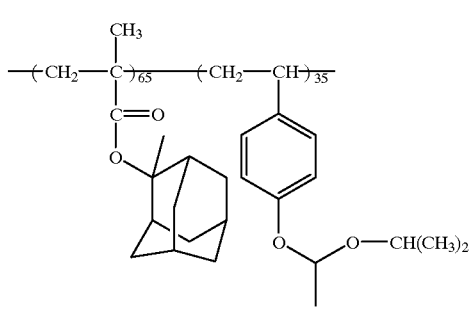
D-2
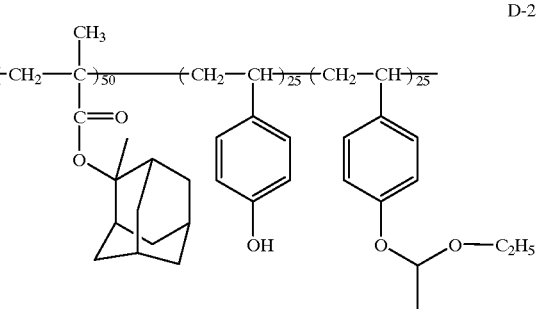
D-3
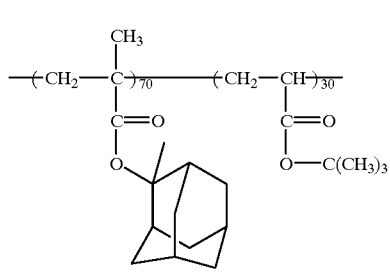
D-4
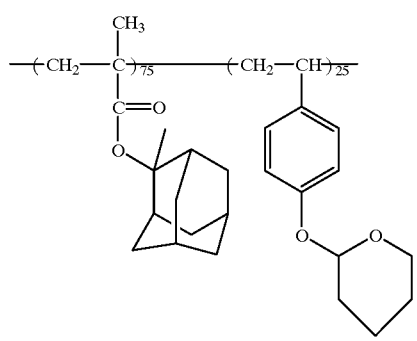

-continued
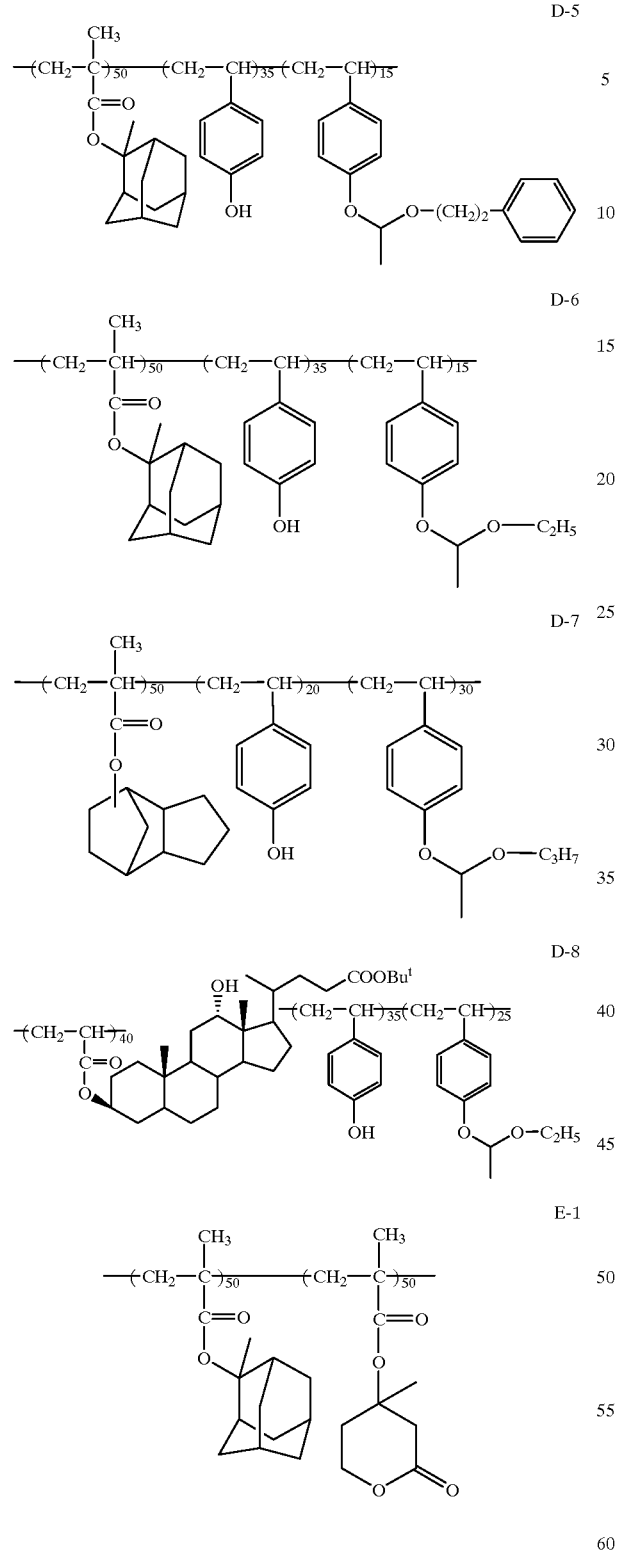
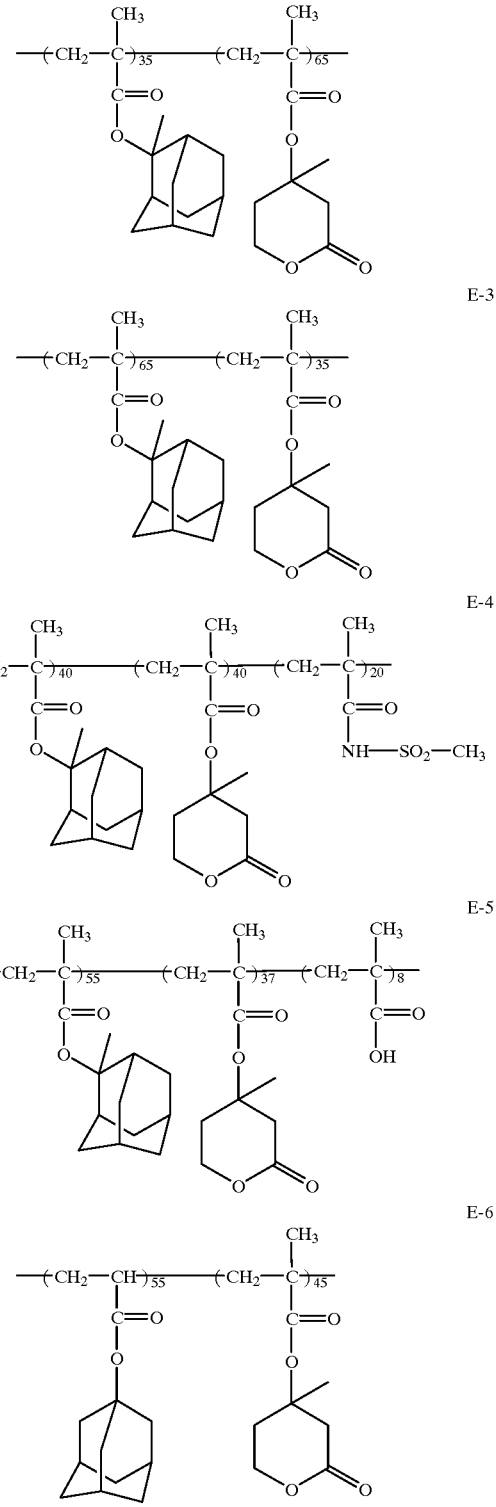

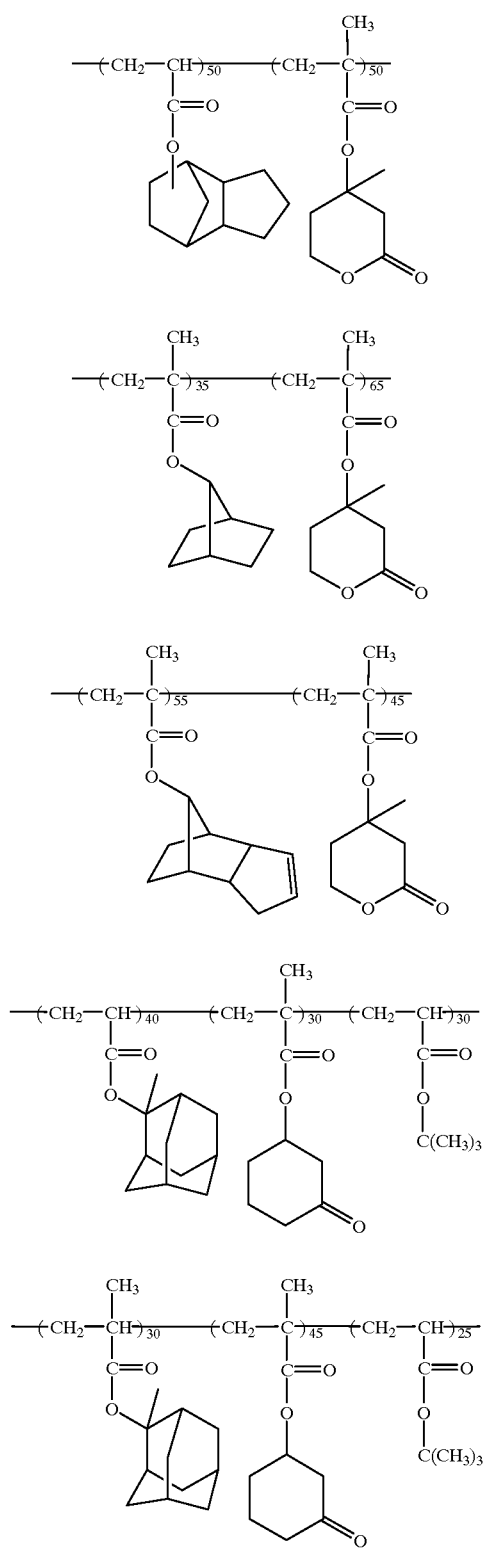
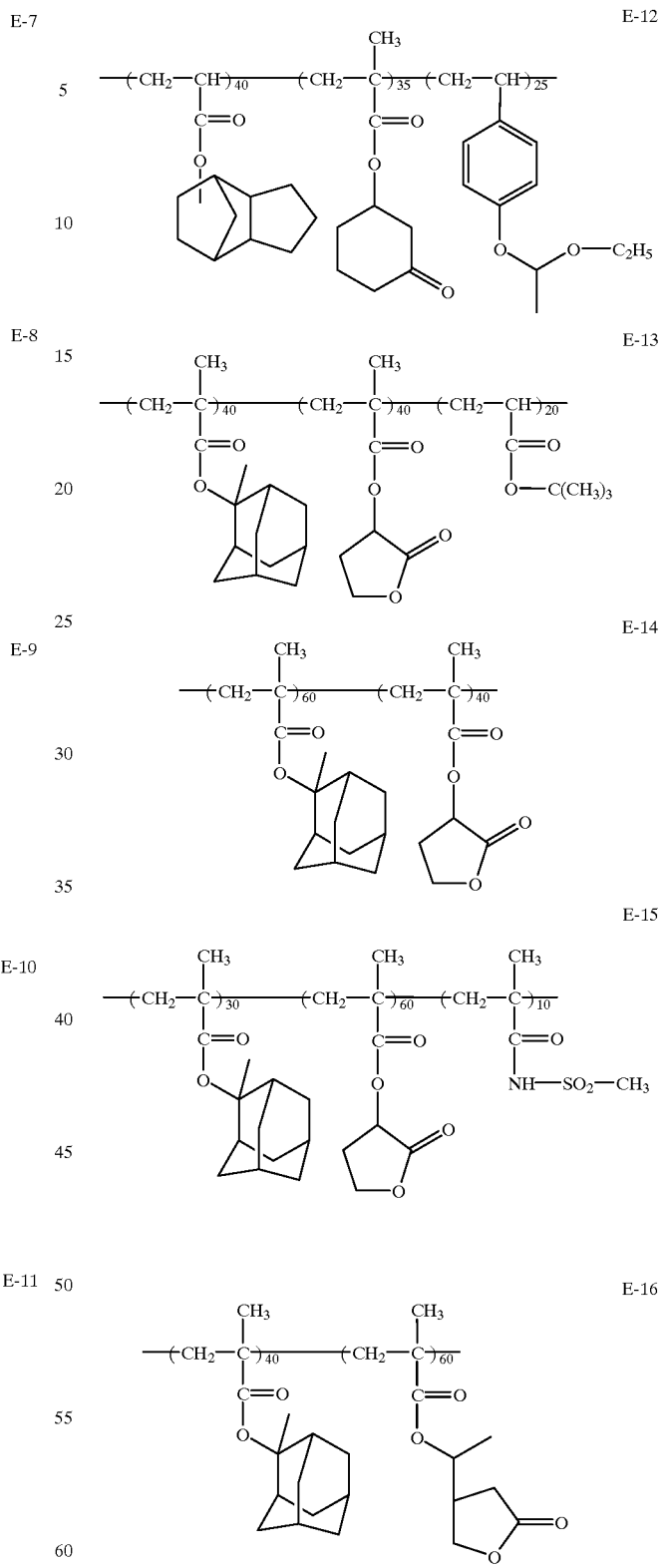

E-17
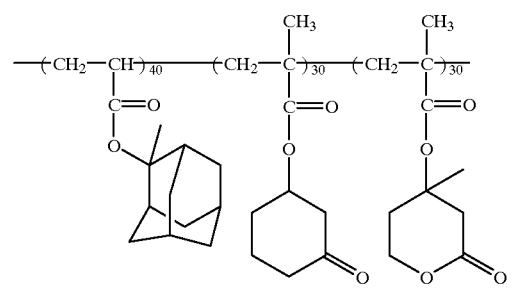
E-18
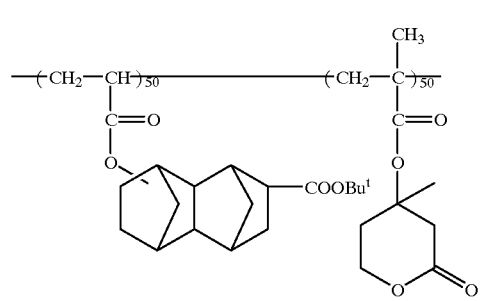
E-19
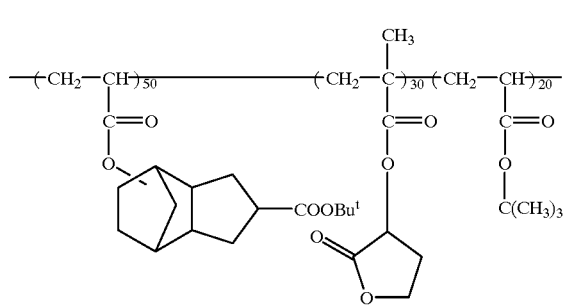
E-20
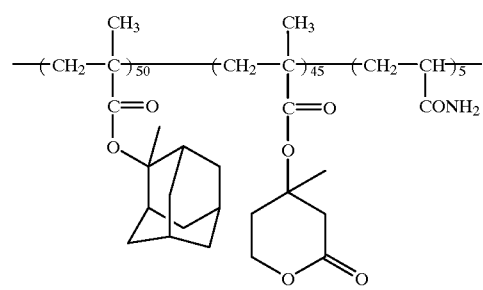
E-21
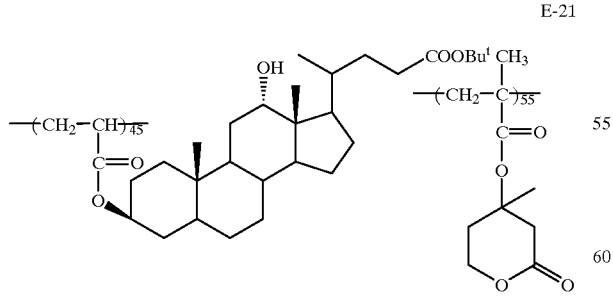
E-22
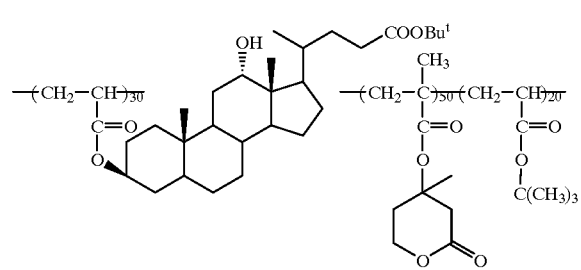
E-23
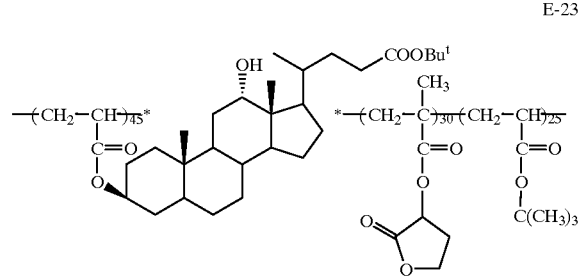
E-24
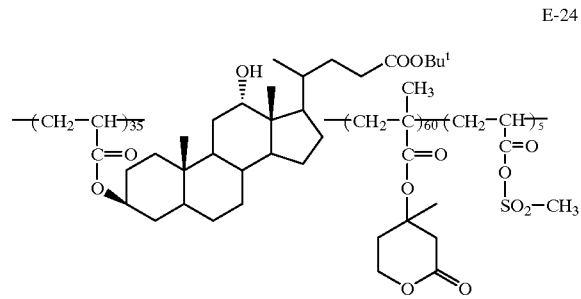
E-25
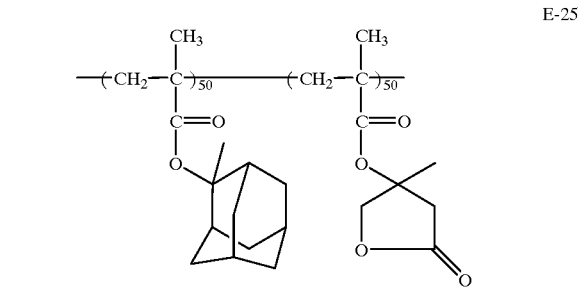
E-26
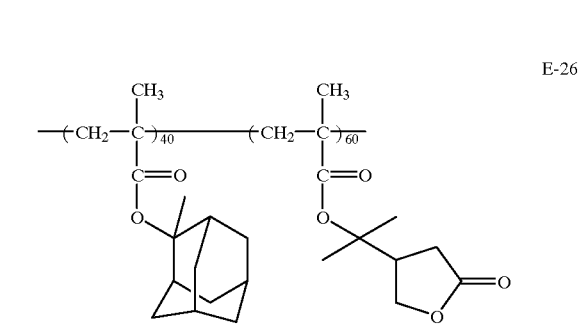

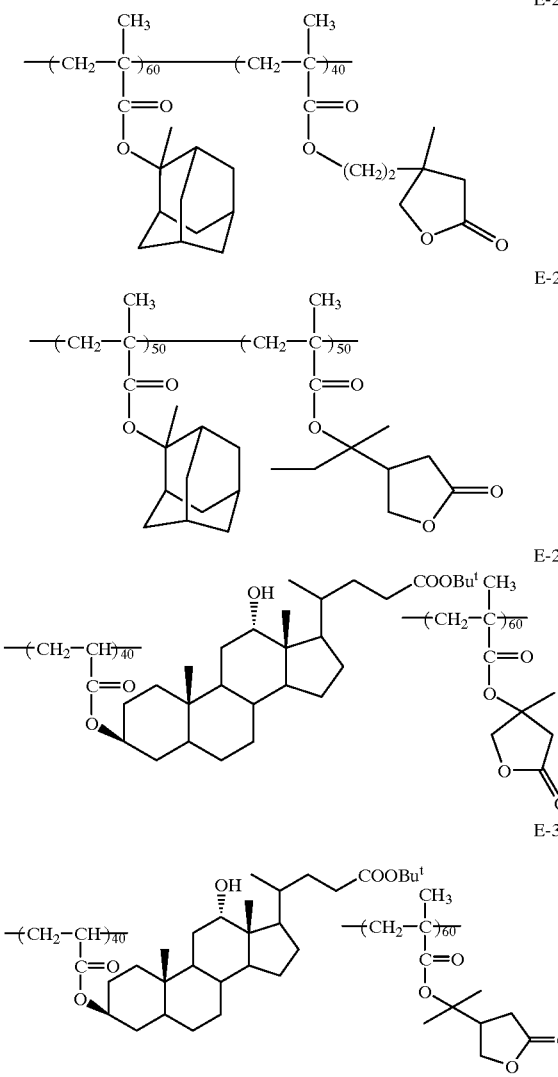

E-27

E-28

E-29

E-30

A polymer of component (f) will be described below.

In formula (X), the alkyl group is preferably an alkyl group having from 1 to 8 carbon atoms, and specific examples of the alkyl groups include a methyl group, an ethyl group, a propyl group, an isopropyl group, a butyl group, and an octyl group.

The cycloalkyl group is preferably a cycloalkyl group having from 4 to 8 carbon atoms, and specific examples of the cycloalkyl groups include a cyclopentyl group, a cyclohexyl group, and a cycloheptyl group.

Examples of the aralkyl groups include a benzyl group, a phenethyl group, and a naphthylethyl group.

The alkoxyl group is preferably an alkoxyl group having from 1 to 4 carbon atoms, and specific examples include a methoxy group, an ethoxi group, a propoxy group, and an isopropoxy group.

The acyl group is preferably an acyl group having from 1 to 4 carbon atoms, and specific examples include a formyl group, an acetyl group, an ethylcarbonyl group and a propylcarbonyl group.

The aryl group is preferably an aryl group having from 6 to 14 carbon atoms, and specific examples include a phenyl group, a biphenyl group and a naphthyl group.

The alkylene group is preferably an alkylene group having from 1 to 8 carbon atoms, and specific examples include a methylene group, an athylene group, a propylene group and a butylene group.

The cycloalkylene group is preferably a cycloalylene group having from 4 to 8 carbon atoms, and specific examples include a cyclohexylene group, a cyclopentylene group, and a cycloheptylene group.

When each of the above-described substituents in formula (X) may further have a substituent, examples of the substituents include a halogen atom, e.g., Cl, Br and F, a —CN group, an —OH group, an alkyl group having from 1 to 4 carbon atoms, a cycloalkyl group having from 3 to 8 carbon atoms, an alkoxyl group having from 1 to 4 carbon atoms, an acylamino group such as an acetylamino group, an aralkyl group such as a benzyl group and a phenethyl group, an allyloxyalkyl group such as a phenoxyethyl group, and a silyl group such as a trimethylsilyl group and a trimethoxy☐silyl group. However, the substituents are not limited thereto.

In light of the miscibility with component (a) polymer, developing solution suitability and high achievement of the objects of the present invention, $R_{101}$, $R_{102}$, $R_{103}$, $R_{106}$, $R_{107}$, which may be the same or different, each preferably represents a hydrogen atom, a halogen atom or an alkyl group, particularly preferably a hydrogen atom or a methyl group.

In formula (X), as the group represented by —$R_{104}$—$(G)_f$, the following groups can be preferably exemplified.

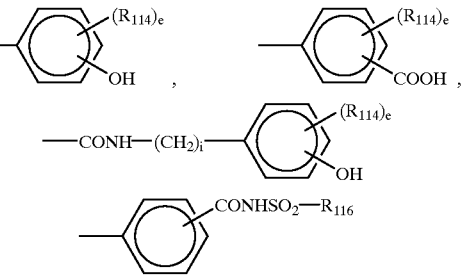

wherein i represents an integer of from 0 to 6.

In formula (X), as the group represented by —$R_{108}$—$(Q)_g$, the following groups can be preferably exemplified.

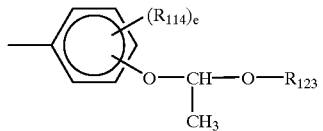

$R_{114}$ more specifically represents an alkyl group having from 1 to 4 carbon atoms, an alkoxyl group having from 1 to 4 carbon atoms, an acetyl group or a chlorine atom.

$R_{116}$ specifically represents an alkyl group having from 1 to 4 carbon atoms, a cyclohexyl group, a phenyl group or a camphor group.

$R_{123}$ preferably represents a halogen atom, an alkyl group having from 1 to 4 carbon atoms, an alkyl group having total carbon atoms oft 10 or less and substituted with an alkoxycarbonyl group, a cyloalkyl group having from 5 to 7 carbon atoms, a benzyl group, a phenethyl group, a phenyloxyalkyl group having from 8 to 12 carbon atoms, or a cyclohexylalkyl group having from 8 to 12 carbon atoms.

With respect to a and b, the case where a/a+b is from 0.05 to 0.95 and b/a+b is from 0.1 to 0.95 is preferred, and the case where a/a+b is from 0.2 to 0.8 and b/a+b is from 0.15 to 0.60 is more preferred.

d preferably represents 0 or 1, and particularly preferably 0. e preferably represents 0, 1 or 2, and particularly preferably 0 or 1. f preferably represents 1 or 2, and particularly preferably 1. g preferably represents 1 or 2, and particularly preferably 1.

A polymer of component (f) may contain two or more kinds of repeating units represented by formula (X).

A polymer of component (f) according to the present invention may have crosslinking structure. As examples of such crosslinking structure, in the above component containing Q, the structure in which $R_{123}$ is a divalent group and makes bonding represented by $-R_{108}-Q-R_{108}-$ can be exemplified.

A polymer of component (f) is preferably a polymer of binary system.

Specific examples of component (f) polymer for use in the present invention are shown below but the present invention is not limited thereto.

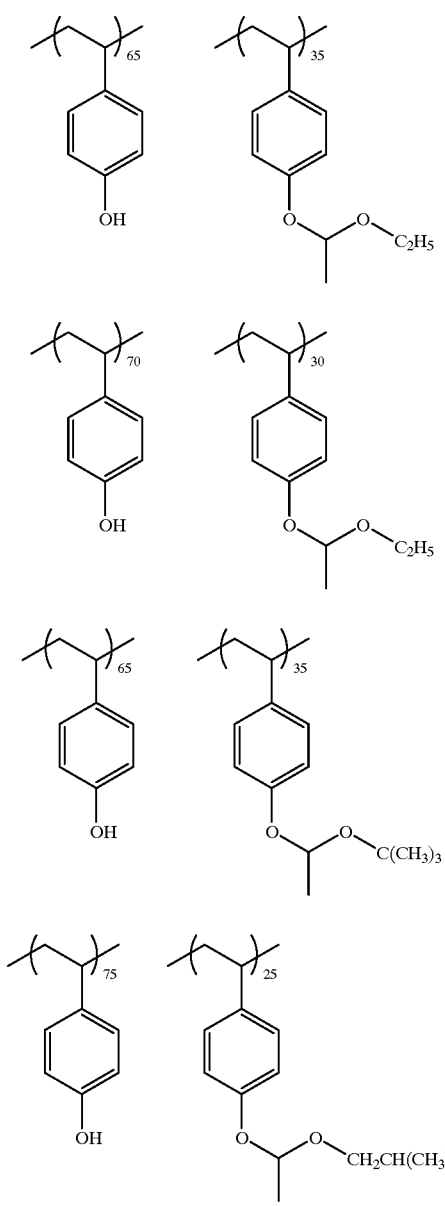

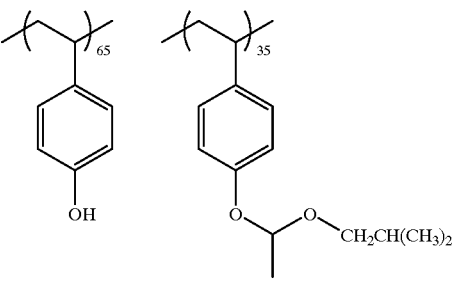

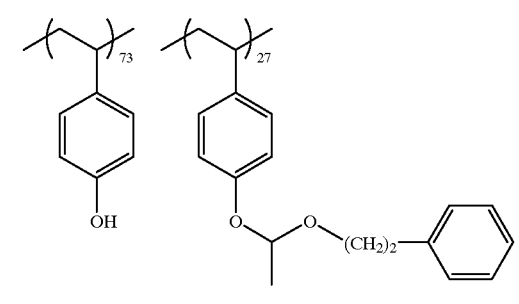

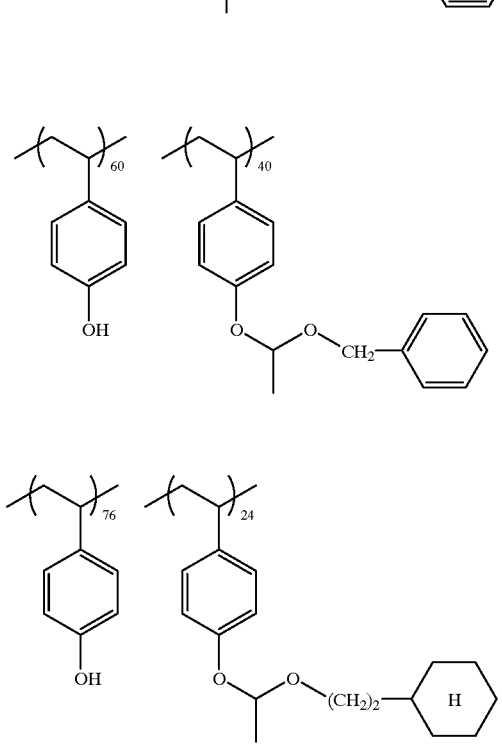

F-10
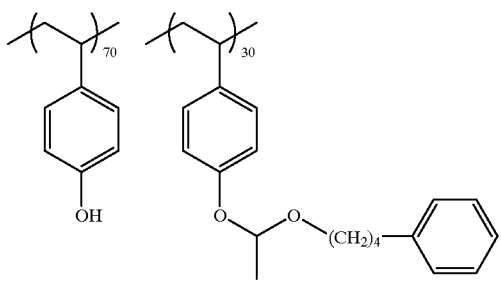

F-11
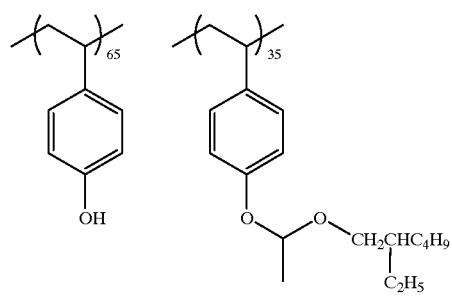

F-12
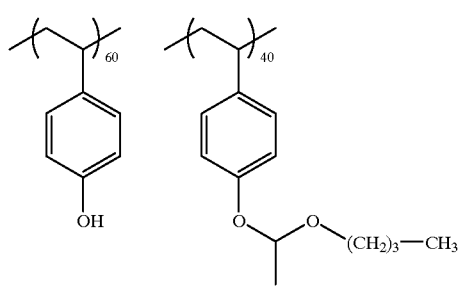

F-13
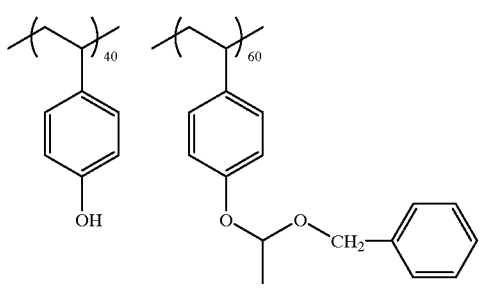

F-14
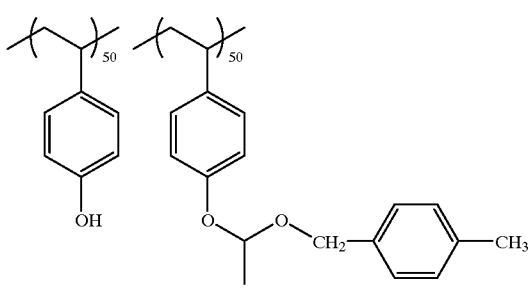

F-15
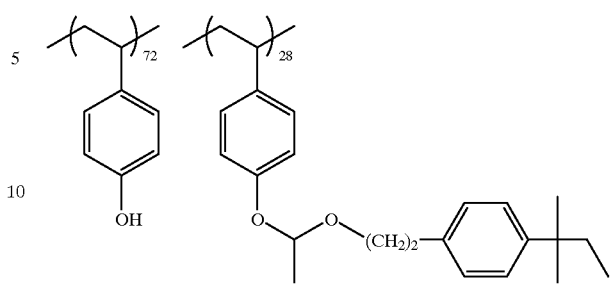

F-16
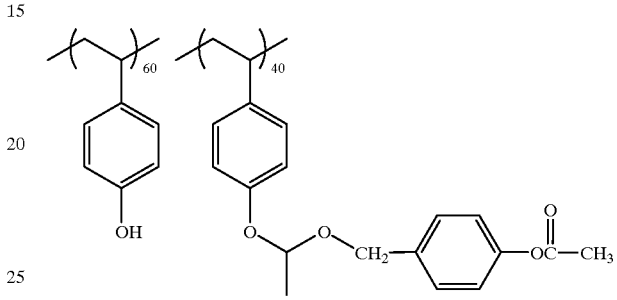

Although the weight-average molecular weight of each polymer of components (c) to (f) is not particularly limited, it is preferably from 1,000 to 100,000, more preferably from 3,000 to 40,000 as a polystyrene calculated value in gel permeation chromatography in view of the miscibility with component (a) polymer, the solubility in an organic solvent, and the balance of performances of the objects of the present invention.

The amount to be used of component (a) polymer according to the present invention is preferably from 10 wt % to 90 wt %, more preferably from 20 wt % to 70 wt %, based on the solid content of the composition of the present invention.

The amount to be used of each polymer of components (c) to (f) according to the present invention is preferably from 10 wt % to 90 wt %, more preferably from 30 wt % to 80 w %, based on the solid content of the composition of the present invention.

In the composition of the present invention, the ratio of the use amount of components (c) to (f) polymers to the use amount of component (a) polymer (weight ratio)(c)/(a), (d)/(a) (e)/(a) or (f)/(a) is preferably from 70/30 to 5/95, more preferably from 60/40 to 20/80, from the viewpoint of the resistance to oxygen plasma etching, resolution, sensitivity, rectangular property of the pattern after development and the like.

The amount to be used of a compound of component (b) according to the present invention is preferably from 0.01 wt % to 20 wt %, more preferably from 0.1 wt % to 10 wt %, based on the solid content of the composition of the present invention. If the use amount of a compound of component (b) is too small, the sensitivityd decreases and high resolution cannot be obtained, whereas if the amount is too much, considerable dimensional fluctuation occurs with the lapse of time after pattern exposure, which is disadvantageous.

The positive photosensitive composition according to the present invention fundamentally comprises three components of (a), (b), and any one of (c) to (f), but alkali-soluble resins may be added for further improving film property and heat resistance.

As such an alkali-soluble resin, polymers having an acidic hydrogen atom having pKa of 11 or less such as a phenolic hydroxyl group, a carboxylic acid group, a sulfonic acid group, an imido group, a sulfonamido group, an N-sulfonylamido group, an N-sulfonylurethane group or an active methylene group are preferably used. Preferred alkali-soluble polymers are novolak-phenol resins, specifically, phenol-formaldehyde resins, o-cresol-formaldehyde resins, m-cresol-formaldehyde resins, p-cresol-formaldehyde resins, xylenol-formaldehyde resins, or condensation products of these resins. As disclosed in JP-A-50-125806, condensation products of phenol or cresol, which is substituted with an alkyl group having from 3 to 8 carbon atoms, with formaldehyde, such as t-butylphenol-formaldehyde resins, can be iused with the above phenol resins. Moreover, polymers containing phenolic hydroxyl group-containing monomer as a copolymer component, such as N-(4-hydroxyphenyl)methacrylamide, homopolymers or copolymers of p-hydroxystyrene, o-hydroxystyrene, m-isopropenylphenol, or p-isopropenylphenol, and partially esterified or etherified polymers of these polymers can also be used in the present invention.

Further, an aromatic polyhydroxy compound as described in JP-A-4-122938, JP-A-2-275955 and JP-A-4-230754 can be added to the composition of the present invention according to the necessity.

Furthermore, the composition of the present invention may contain an organic base compound.

Each component of (a), (b), (c), (d), (e) and (f) in the composition of the present invention may be dissolved in a solvent. Examples of solvents preferably used in the present invention include ketones, e.g., methyl ethyl ketone and cyclohexanone, alcohol ethers, e.g., ethylene glycol monomethyl ether and ethylene glycol monoethyl ether, ethers, e.g., dioxane, ethylene glycol dimethyl ether, cellosolve acetates, e.g., methyl cellosolve acetate and ethyl cellosolve acetate, fatty acid esters, e.g., butyl acetate, methyl lactate, and ethyl lactate, halogenated hydrocarbons, e.g., 1,1,2-trichloroethylene, and highly polar solvents, e.g., dimethylacetamide, N-methylpyrrolidone, dimethylformamide, and dimethylsulfoxide. These solvents can be used alone or in combination of two or more.

The positive photosensitive composition according to the present invention can contain dyes, plasticizers, auxiliary adhesives, and surfactants, if necessary. Specific examples include dyes such as Methyl Violet, Crystal Violet and Malachite Green, plasticizers such as stearic acid, acetal resins, phenoxy resins, alkyd resins, and epoxy resins, auxiliary adhesives such as hexamethyldisilazane and chloromethylsilane, and surfactants such as nonylphenoxypoly(ethyleneoxy)ethanol and octylphenoxypoly(ethyleneoxy)ethanol.

Dyes containing an alkali-soluble group such as an aromatic hydroxyl group anda carboxylic acid group in the molecule, e.g., curcumin, are advantageously used.

The above-described positive photoresist composition of the present invention is coated by an appropriate coating means such as a spinner or a coater on a substrate commonly used in the production of precision integrated circuit devices (e.g., a silicon/silicon dioxide-coated substrate), glass, ceramic, metal, etc., in a thickness of from 0.5 to 3 $\mu$m, exposed through a predetermined mask, and then subjected to development, thereby an excellent resist can be obtained. For improving the coating property, it is preferred to add surfactants containing a fluorine-substituted group and a silicon-containing group lo thereby reduce the surface tension.

The developing solution for the positive photoresist composition of the present invention include, e.g., alkaline aqueous solutions of inorganic alkalis such as sodium hydroxide, potassium hydroxide, sodium carbonate, sodium silicate, sodium metasilicate, and aqueous ammonia; primary amines such as ethylamine and n-propylamine; secondary amines such as diethylamine and di-n-butylamine; tertiary amines such as triethylamine and methyldiethylamine; alcohol amines such as dimethylethanolamine and triethanolamine; quaternary ammonium salts such as tetramethylammonium hydroxide and tetraethylammonium hydroxide; and cyclic amines such as pyrrole and piperidine. Moreover, alcohols, surfactants, and aromatic hydroxyl group-containing compounds may be added to these alkaline aqueous solutions. The use of tetraammonium hydroxide is particularly preferred.

When the photosensitive composition according to the present invention is used as the upper layer resist of the two-layer resist, etching of the lower organic polymer layer by oxygen plasma is conducted with the upper layer resist pattern as the protective mask, and the upper layer resist has sufficient oxygen plasma resistance. Although the oxygen plasma resistance of the photosensitive composition according to the present invention depends upon the silicon content of the upper layer resist, the etching apparatus, and the etching condition as well, the selection ratio of etching (the speed ratio of etching of the lower layer and upper laver resist) can be taken in a sufficiently broad range, such as from 1o to 100.

In the pattern-forming method by the photosensitive composition according to the present invention, an organic polymer layer is formed in the first place on a substrate to be processed. Various kinds of well-known photoresists can be used for this organic polymer layer, for example, FH series and FHi series (manufactured by Fujifilm Olin Co., Ltd.), OiR series (manufactured by Olin Co., Ltd.), and PFI series (manufactured by Sumitomo Chemical Co., Ltd.) can be exemplified. This organic polymer layer is formed by dissolving these photoresists in an appropriate solvent, and coating the obtained coating solution by spin coating or spray coating. Subsequently, the layer of the photosensitive composition according to the present invention is formed on the above-obtained first organic polymer layer. The second layer is formed in the same procedure as the formation of the first layer, i.e., by dissolving the resist material in an appropriate solvent, and coating the obtained coating solution by spin coating or spray coating.

The thus-obtained second layer resist is then subjected to pattern-forming process. As the first stage of the process, the second layer, i.e., the resist composition of the upper layer, is undergone pattern forming process. Mask alignment is performed, if necessary. By irradiating high energy radiation through the mask, the resist composition of the irradiated part becomes soluble in an alkaline aqueous solution, and a pattern is formed by development in the alkaline aqueous solution. After that, etching of the organic polymer layer is performed as the second stage. This process is performed by oxygen plasma etching with the above pattern of the resist composition layer as the mask, thereby a highly precise pattern having a high aspect ratio can be formed. This etching of the organic polymer layer by oxygen plasma etching is completely the same technique as the plasma ashing utilized in peeling of a resist layer conducted after completion of etching process of a substrate by conventional photo-etching. This operation can be effected using oxygen as reactive gas, i.e., etching gas, by a cylindrical plasma etching apparatus or a parallel plate type plasma etching apparatus.

Further, the substrate is processed with this resist pattern as a mask. Dry etching methods such as sputter etching, gas plasma etching and ion beam etching can be used for this processing.

Etching process by two-layer resist system including the layers of the photosensitive composition of the present invention is completed by the peeling operation of the resist layer. The peeling of the resist layer can be performed solely by dissolving process of the organic polymer material of the first layer. The organic polymer material is an arbitrary photoresist and is not decomposed (cured) at all by the above-described photo-etching operation, therefore, each of well-known organic solvent of the photoresist itself can be used. Alternatively, peeling can be performed by processing such as plasma etching, etc., without using a solvent.

EXAMPLES

The present invention is explained in more detail with reference to the following examples, but the present invention should not be construed as being limited thereto.

Preparation Example 1

Synthesis of Component (a) Polymer (silsesquioxane polymer)

Into a flask having a capacity of 300 ml equipped with a stirrer, a thermometer and a dropping funnel were put 15 g of aluminum chloride anhydride and 50 ml of acetyl chloride and the mixture was stirred. Then, a solution comprising 50 ml of acetyl chloride having dissolved therein 5 g of polyphenylsilsesquioxane having a molecular weight of 4,200 was gradually added dropwise to the flask. The temperature of the reaction system was maintained at 25° C. and reaction was continued. Hydrogen chloride occurred with the advancement of the reaction. After 3 hours of reaction, the system was cooled and the content was poured into 250 g of ice water. Aluminum chloride was decomposed with well stirring, and 50 g of ethyl ether was added to thereby dissolve the precipitate. After removing the water layer, 100 g of water was added to sufficiently permeare the ether layer. After removing the water layer, ether was evaporated, and finally dried with a vacuum drier. The molecular weight of the obhained polymer was 4,500, and it was confirmed by elemental analysis that the polymer contained 23.2% of silicon element.

Preparation Example 2

Synthesis of Component (a) Polymer (silsesquioxane polymer)

A polymer corresponding to component (a) of the present invention was synthesized in the same manner as in Preparation Example 1 except for using 5 g of polyphenylmethylsilsesquioxane having a molecular weight of 3,800. The molecular weight of the obtained polymer was 3,900, and it was confirmed by elemental analysis that the polymer contained 25.2% of silicon element.

Preparation Example 3

Synthesis of Component (e) Polymer

Synthesis of Polvmer E-1

2-Methyl-2-adamantyl methacrylate and mevalonic methacrylate of a proportion of 50/50 were charged, and dissolved in a mixed solvent of N,N-dimethylacetamide/tetrahydrofuran of 5/5 and 100 ml of a solution having a solid content concentration of 20% was prepared. V-65 (manufactured by Wako Pure Chemical Industries, Ltd.) in an amount of 3 mol % and mercaptoethanol in an amount of 6 mol % were added to the above-prepared solution, and the mixed solution was added dropwise to 10 ml of tetrahydrofuran heated at 60° C. under nitrogen atmosphere over 3 hours. After dropwise addition, the reaction solution was heated and stirred for 6 hours. After termination of the reaction, the reaction solution was cooled to room temperature, crystallized in 3 liters of methanol, and the precipitated white powder was recovered.

In Polymer E-1, the composition ratio of the polymer obtained by $C^{13}NMR$ was 50/50 and the weight-average molecular weight of standard polystyrene calculated value obtained by gel permeation chromatography (GPC) was 7,800.

Other polymers were also synthesized in a manner similar to the above.

Example 1

One (1) gram of the silsesquioxane polymer obtained in Preparation Example 1, 1 g of Polymer E-1, 0.04 g of triphenylsulfonium-2,4,6-triisopropylphenylsulfonate, and 0.005 g of triphenylimidazole were dissolved in 18 g of methoxypropyl acetate. The thus-obtained solution was thoroughly filtered through a membrane filter having a pore diameter of 0.1 μm, thereby a silicon-containing photosensitive composition was obtained.

FHi-028D resist (resist for i-line, manufactured by Fujifilm Olin Co., Ltd.) was coated on a silicon wafer by means of a coater CDS-650 (manufactured by Canon Inc.), and baked at 90° C. for 90 seconds, thereby a uniform film having a thickness of 0.85 μm was obtained. The film was further heated at 200° C. for 3 minutes, as a result, the thickness of the film was decreased to 0.70 μm. The above-prepared silicon-containing photosensitive comoosition was coated thereon, baked at 110° C. for 60 seconds to thereby obtain a coated film having a film thickness of 0.20 μm.

The thus-obtained wafer was subjected to exposure using KrF excimer laser stepper FPA-3000 EX4 (manufactured by Canon Inc.) equipped with a resolution mask with varying the exposure amount and the focus. The exposed wafer was then heated at 120° C. for 90 seconds in a clean room, developed with a tetramethylammoniun hydroxide developing solution (2.38%) for 60 seconds, rinsed with distilled water, dried, and a pattern (an upper layer pattern) was obtaIned. The pattern was observed with a scanning electron microscope.

Further, the above wafer having the resist pattern of the upper layer was subjected to etching (dry etching) with a parallel plate type reactive ion etching apparatus (manufactured by ULVAC Corporation) and the pattern was formed on the lower layer. Oxygen was used as etching gas, the pressure was 20 milli-Torr, applied power was 100 mW/cm² and etching was performed for 15 minutes. The result of etching was observed with a scanning electron microscope.

Sensitivity, resolution, depth of focus, and dimensional fluctuation were evaluated.

Sensitivity: Evaluated by the exposure amount of the time when line/space of 0.18 μm of the mask was reproduced by the pattern of the upper layer.

Resolution: Evaluatedby the minimum dimension of separation and resolution of line/space at the lowor layer at the exposure amount of the time when line/space of 0.18 μm of the mask was reproduced.

Depth of focus: Exposure was performed by stepwise deviating the focus and evaluated by the width of fluctuation of focus capable of resolving 0.18 μm line at the lower layer.

Dimensional fluctuation (shift) of pattern: Evaluated by the difference between the dimension of the pattern of the upper layer resist formed by exposure and wet development and the dimension of the pattern after being formed on the lower layer by dry development.

As a result of evaluation, sensitivity was 22 mJ/cm$^2$ and line/space of 0.14 μm (resolution) was resolved. Film thickness loss of 0.18 μm line was as small as 1.5%, and the cross section of the line was a trapezoid inclining toward a rectangle.

A vertical pattern of a width of 0.18 μm was formed as film thickness of 0.8 μm and a width of 1.2 μm of depth of focus, and dimensional shift of 0.18 μm was as small as 0.005 μm.

Example 2

Photosensitive composition was prepared in the same manner as in Example 1 except that 1 g of the silsesquioxane polymer obtained in Preparation Example 2 was used in place of 1 g of silsesquioxane polymer used in Example 1 and Polymer E-26 (weight-average molecular weight: 6,800) was used in place of Polymer E-1. The prepared photosensitive composition was subjected to exposure and development in the same manner as in Example 1 and evaluated. Sensitivity was 36 mJ/cm$^2$ and line/space of 0.13 μm was resolved. Film thickness loss of 0.18 μm line was as small as 2.5%, and the cross section of the line was a trapezoid inclining toward a rectangle.

After etching in the same manner as in Example 1, depth of focus of 0.18 μm was 1.0 μm and dimensional shift was as small as 0.007 μm.

Examples 3 to 20 and Comparative Examples 1 and 2

Each photosensitive composition was prepared in the same manner as in Example 1 except that component (b) and component (c) to (e) shown in Table 1 were used in place of component (b) and component (e) in Example 1. Each photosensitive composition prepared was subjected to exposure, development and etching, observed with a scanning electron microscope, and evaluated in the same manner as above. The results obtained are shown in Table

TABLE 1

| Example No. | Component (b) | Component (c) to (e) (weight-average molecular weight) |
|---|---|---|
| 3 | Triphenylsulfonium-2,4,6-triisopropylphenylsulfonate | E-5 (8,300) |
| 4 | Triphenylsulfonium-2,4,6-triisopropylphenylsulfonate | E-6 (5,700) |
| 5 | Triphenylsulfonium-2,4,6-triisopropylphenylsulfonate | E-25 (11,000) |

TABLE 1-continued

| Example No. | Component (b) | Component (c) to (e) (weight-average molecular weight) |
|---|---|---|
| 6 | Triphenylsulfonium trifluoromethanesulfonate | E-5 (8,300) |
| 7 | Triphenylsulfonium pentafluorophenylsulfonate | E-13 (4,800) |
| 8 | Triphenylsulfonium-p-dodecylphenyl-sulfonate | E-16 (9,700) |
| 9 | Triphenylsulfonium-p-dodecylphenyl-sulfonate | E-2 (7,500) |
| 10 | Triphenylsulfonium-p-dodecylphenyl-sulfonate | E-14 (6,200) |
| 11 | Triphenylsulfonium-p-dodecylphenyl-sulfonate | E-19 (9,200) |
| 12 | Triphenylsulfonium-p-dodecylphenyl-sulfonate | E-4 (8,000) |
| 13 | Triphenylsulfonium-p-dodecylphenyl-sulfonate | C-2 (9,100) |
| 14 | Triphenylsulfonium-p-dodecylphenyl-sulfonate | C-4 (12,000) |
| 15 | Bis(t-amylphenyl)iodonium-p-toluenesulfonate | C-8 (6,900) |
| 16 | Bis(t-amylphenyl)iodonium-p-toluenesulfonate | C-9 (10,200) |
| 17 | Bis(t-amylphenyl)iodonium-p-toluenesulfonate | D-2 (5,900) |
| 18 | Bis(t-amylphenyl)iodonium-p-toluenesulfonate | D-5 (7,300) |
| 19 | Bis(t-amylphenyl)iodonium-p-toluenesulfonate | D-6 (8,800) |
| 20 | Bis (t-amylphenyl)iodonium-p-toluenesulfonate | D-7 (9,500) |
| Comparative Example1 | Triphenylsulfonium-2,4,6-triisopropylphenylsulfonate | Comparative Polymer-1 (7,900) |
| Comparative Example2 | Triphenylsulfonium-2,4,6-triisopropylphenylsulfonate | Comparative Polymer-2 (10,000) |

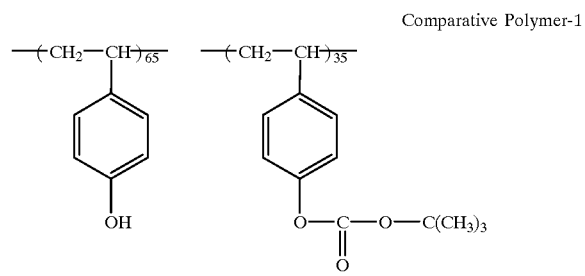

Comparative Polymer-1

Comparative Polymer-2

TABLE 3

| Example No. | Resolution (μm) | Sensitivity (mJ/cm²) | Film Thickness Loss of 0.18 μm Line (%) | Dimensional Shift after Etching (0.18 μm line) (μm) | Depth of Focus of 0.18 μm line after Etching (μm) |
|---|---|---|---|---|---|
| 3 | 0.15 | 17 | 2 | 0.008 | 1.05 |
| 4 | 0.145 | 25 | 3.5 | 0.007 | 0.90 |
| 5 | 0.155 | 28 | 3 | 0.009 | 0.90 |
| 6 | 0.14 | 14 | 4.5 | 0.007 | 1.05 |
| 7 | 0.15 | 18 | 3.5 | 0.010 | 0.90 |
| 8 | 0.135 | 26 | 5.5 | 0.008 | 1.0 |
| 9 | 0.135 | 30 | 2 | 0.007 | 1.05 |
| 10 | 0.145 | 32 | 2 | 0.010 | 1.2 |
| 11 | 0.15 | 35 | 2.5 | 0.007 | 0.90 |
| 12 | 0.155 | 27 | 4 | 0.008 | 1.05 |
| 13 | 0.15 | 29 | 2 | 0.009 | 0.90 |
| 14 | 0.15 | 33 | 2 | 0.007 | 1.1 |
| 15 | 0.135 | 27 | 3 | 0.008 | 1.05 |
| 16 | 0.135 | 25 | 5 | 0.009 | 0.90 |
| 17 | 0.16 | 30 | 4 | 0.008 | 0.05 |
| 18 | 0.155 | 26 | 3 | 0.008 | 0.90 |
| 19 | 0.15 | 32 | 2.5 | 0.008 | 1.1 |
| 20 | 0.15 | 30 | 2.5 | 0.010 | 1.1 |
| Comparative Example 1 | 0.175 | 45 | 8 | 0.015 | 0.55 |
| Comparative Example 2 | 0.18 | 22 | 16 | 0.045 | 0.60 |

One (1) gram of the silsesquioxane polymer obtained in Preparation Example 1, 1 g of polymer of Compound F-1 (weight-average molecular weight: 6,500), 0.03 g of triphenylsulfonium-2,4,6-triisopropylphenylsulfonate, and 0.008 g of triphenylimidazole were dissolved in 18.55 g of methoxypropyl acetate. The thus-obtained solution was thoroughly filtered through a membrane filter having a pore diameter of 0.1 μm, thereby a silicon-containing photosensitive composition was obtained.

FHi-028D resist (resist for i-line, manufactured by Fujifilm Olin Co., Ltd.) was coated on a silicon wafer by means of a coater CDS-650 (manufactured by Canon Inc.), and baked at 90° C. for 90 seconds, thereby a uniform film having a thickness of 0.83 μm was obtained.

The film was further heated at 200° C. for 3 minutes, as a result, the thickness of the film was decreased to 0.70 μm. The above-prepared silicon-containing photosensitive composition was coated thereon, baked at 130° C. for 60 seconds to thereby obtain a coated film having a film thickness of 0.20 μm.

The thus-obtained wafer was subjected to exposure using KrF excimer laser stepper FPA-3000 EX4 (manufactured by Canon Inc.) equipped with a resolution mask with varying the exposure amount and the focus. The exposed wafer was then heated at 120° C. for 90 seconds in a clean room, developed with a tetramethylammonium hydroxide developing solution (2.38%) for 60 seconds, rinsed with distilled water, dried, and a pattern (an upper layer pattern) was obtained. The pattern was observed with a scanning electron microscope.

Further, the above wafer having the resist pattern of the upper layer was subjected to etching (dry etching) with a parallel plate type reactive ion etching apparatus (manufactured by ULVAC Corporation) and the pattern was formed on the lower layer. Oxygen was used as etching gas, the pressure was 20 milli-Torr, applied power was 100 mW/cm² and etching was performed for 15 minutes. The result of etching was observed with a scanning electron microscope.

Sensitivity, resolution, depth of focus, and dimensional fluctuation were evaluated.

(1) Sensitivity: Evaluated by the exposure amount of the time when line/space of 0.18 μm of the mask was reproduced by the pattern of the upper layer.

(2) Resolution: Evaluated by the minimum dimension of separation and resolution of line/space at the lower layer at the exposure amount of the time when line/space of 0.18 μm of the mask was reproduced.

(3) Depth of focus: Exposure was performed by stepwise deviating the focus and evaluated by the width of fluctuation of focus capable of resolving 0.18 μm line at the lower layer.

(4) Dimensional fluctuation (shift) of pattern: Evaluated by the difference between the dimension of the pattern of the upper layer resist formed by exposure and wet development and the dimension of the pattern after being formed on the lower layer by dry development.

As a result of evaluation, sensitivity was 19 mJ/cm² and line/space of 0.14 μm (resolution) was resolved. Film thickness loss of 0.18 μm line was as small as 2. 0%, and the cross section of the line was a trapezoid inclining toward a rectangle.

A vertical pattern of a width of 0.18 μm was formed as film thickness of 0.8 μm and a width of 1.0 μm of depth of focus, and dimensional shift of 0.18 μm was as small as 0.007 μm.

Example 22

Photosensitive composition was prepared in the same manner as in Example 21 except that 1 g of the silsesquioxane polymer obtained in Preparation Example 2 was used in place of 1 g of silsesquioxane polymer used in Example 21 and Compound F-3 (weight-average molecular weight: 7,200) was used in place of Compound F-1. The prepared photosensitive composition was subjected to exposure and development.

Sensitivity was 23 mJ/cm² and line/space of 0.15 μm was resolved. Film thickness loss of 0.18 μm line was as small as 1.5%, and the cross section of the line was a trapezoid or a rectangle.

After etching in the same manner as in Example 21, depth of focus of 0.18 μm was 1.1 μm and dimensional shift was as small as 0.007 μm.

Examples 23 to 40 and Comparative Examples 3 and 4

Each photosensitive composition was prepared in the same manner as in Example 21 except that component (b) and component (f) shown in Table 4 were used in place of component (b) and component (f) in Example 21. Each photosensitive composition prepared was subjected to exposure, development and etching, observed with a scanning electron microscope, and evaluated in the same manner as in Example 21. The results obtained are shown in Table 5.

TABLE 4

| Example No. | Component (b) | Component (f) (wt. av. mol. wt.) |
|---|---|---|
| 23 | Triphenylsulfonium-2,4,6-triisopropylphenylsulfonate | F-4 (6,800) |
| 24 | Triphenylsulfonium-2,4,6-triisopropylphenylsulfonate | F-5 (7,500) |

TABLE 4-continued

| Example No. | Component (b) | Component (f) (wt. av. mol. wt.) |
|---|---|---|
| 25 | Triphenylsulfonium-2,4,6-triisopropylphenylsulfonate | F-8 (8,000) |
| 26 | Triphenylsulfonium trifluoromethanesulfonate | F-4 (6,800) |
| 27 | Triphenylsulfonium pentafluorophenylsulfonate | F-5 (7,500) |
| 28 | Triphenylsulfonium-p-dodecylphenyl-sulfonate | F-6 (5,900) |
| 29 | Triphenylsulfonium-p-dodecylphenyl-sulfonate | F-9 (7,700) |
| 30 | Triphenylsulfonium-p-dodecylphenyl-sulfonate | F-4 (6,800) |
| 31 | Triphenylsulfonium-p-dodecylphenyl-sulfonate | F-11 (7,500) |
| 32 | Triphenylsulfonium-p-dodecylphenyl-sulfonate | F-13 (7,000) |
| 33 | Triphenylsulfonium-p-dodecylphenyl-sulfonate | F-2 (8,500) |
| 34 | Triphenylsulfonium-p-dodecylphenyl-sulfonate | F-16 (5,800) |
| 35 | Bis(t-amylphenyl)iodonium-p-toluenesulfonate | F-5 (7,500) |
| 36 | Bis(t-amylphenyl)iodonium-p-toluenesulfonate | F-13 (7,000) |
| 37 | Bis(t-amylphenyl)iodonium-p-toluenesulfonate | F-12 (7,500) |
| 38 | Bis(t-amylphenyl)iodonium-p-toluenesulfonate | F-10 (7,800) |
| 39 | Bis(t-amylphenyl)iodonium-p-toluenesulfonate | F-1 (6,500) |
| 40 | Bis(t-amylphenyl)iodonium-p-toluenesulfonate | F-3 (7,200) |
| Comparative Example 3 | Triphenylsulfonium-2,4,6-triisopropylphenylsulfonate | Comparative Polymer-3 (6,800) |
| Comparative Example 4 | Triphenylsulfonium-2,4,6-triisopropylphenylsulfonate | Comparative Polymer-4 (6,300) |

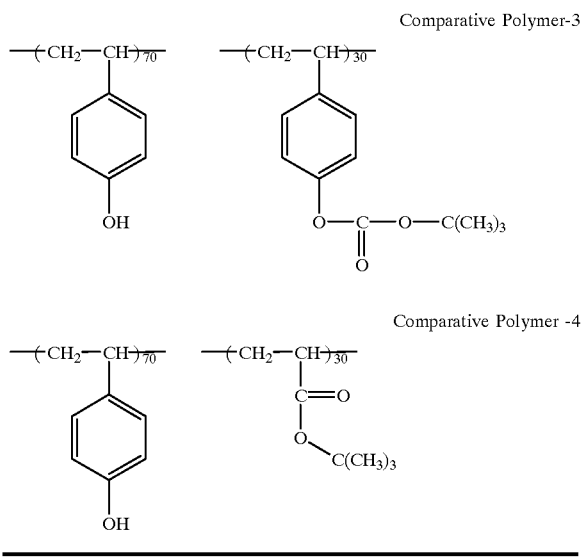

Comparative Polymer-3

Comparative Polymer -4

TABLE 5

| Example No. | Resolution (μm) | Sensitivity (mJ/cm²) | Film Thickness Loss of 0.18 μm Line (%) | Dimensional Shift after Etching (0.18 μm line) (μm) | Depth of Focus of 0.18 μm line after Etching (μm) |
|---|---|---|---|---|---|
| 23 | 0.145 | 16 | 3.5 | 0.007 | 1.2 |
| 24 | 0.15 | 27 | 1.5 | 0.005 | 0.90 |
| 25 | 0.15 | 29 | 1.0 | 0.006 | 1.00 |
| 26 | 0.155 | 13 | 3.0 | 0.009 | 0.85 |
| 27 | 0.14 | 19 | 2.0 | 0.010 | 0.95 |
| 28 | 0.14 | 22 | 4.0 | 0.009 | 1.10 |
| 29 | 0.15 | 25 | 4.0 | 0.007 | 1.05 |
| 30 | 0.15 | 29 | 2.5 | 0.011 | 1.00 |
| 31 | 0.14 | 25 | 1.5 | 0.008 | 0.95 |
| 32 | 0.16 | 33 | 1.0 | 0.010 | 1.00 |
| 33 | 0.15 | 23 | 2.0 | 0.009 | 0.95 |
| 34 | 0.155 | 28 | 2.0 | 0.008 | 0.85 |
| 35 | 0.15 | 30 | 2.5 | 0.009 | 0.95 |
| 36 | 0.16 | 30 | 1.5 | 0.009 | 1.00 |
| 37 | 0.15 | 26 | 3.5 | 0.011 | 1.05 |
| 38 | 0.145 | 29 | 2.0 | 0.010 | 0.95 |
| 39 | 0.155 | 22 | 2.5 | 0.009 | 1.00 |
| 40 | 0.15 | 24 | 1.5 | 0.008 | 0.95 |
| Comparative Example 3 | 0.18 | 28 | 4.5 | 0.025 | 0.55 |
| Comparative Example 4 | 0.195 | 40 | 6.5 | 0.020 | 0.65 |

It is apparent from the results of evaluation of Examples 21 to 40 that the positive silicone-containing photosensitive composition according to the present invention shows high sensitivity, high resolution, less film thickness loss after exposure, less dimensional fluctuation after etching, broad width of the depth of focus, and broad processing tolerance.

On the other hand, in the case of Comparative Example 3 in which the polymer specified by the present invention is not used, although sensitivity is excellent, other characteristics are inferior. In the case of Comparative Example 4, every characteristics are inferior.

The present invention can provide a photosensitive composition having high sensitivity and high resolution in semiconductor device production. Specifically, the present invention can provide a photosensitive composition which exhibits little light absorption in deep ultraviolet region and can cope with short wavelength light sources. Further, the present invention can provide a positive photosensitive composition which causes little film thickness loss after development process when fine pattern of a line width of 0.2 μm or less is formed and gives a rectangular shape resist. Further, according to the present invention, a positive photosensitive composition which causes less dimensional shift (dimensional fluctuation) in pattern transfer to the lower layer in oxygen plasma process and is excellent in dimensional reproduction and processing tolerance can be obtained. Accordingly, the positive silicone-containing photosensitive composition according to the present invention is most suitably used in the mass-production of a semiconductor substrate having ultrafine circuits.

While the invention has been described in detail and with reference to specific examples thereof, it will be apparent to one skilled in the art that various changes and modifications can be made therein without departing from the spirit and scope thereof.

What is claimed is:

1. A positive silicone-containing photosensitive composition which comprises:
   (a) a water-insoluble and alkali-soluble polymer having a structure represented by the following formula (I) and/ or (II):

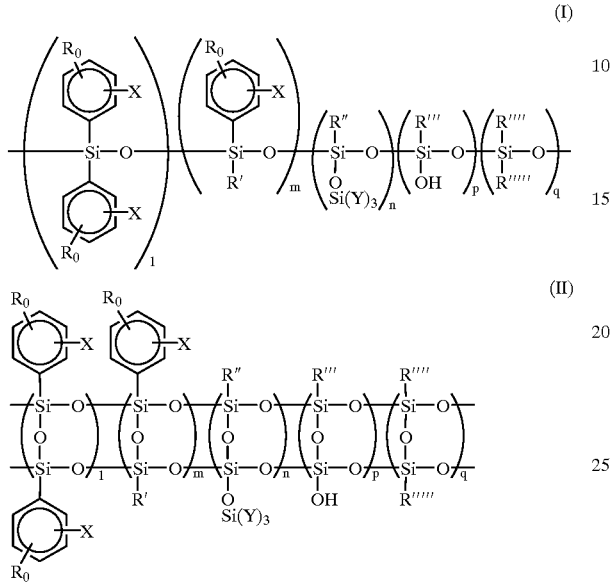

wherein X represents a group selected from the group consisting of a —C(=O)—R group, a —CH(OH)—R group, and a carboxyl group, and a plurality of X's may be the same or different; R represents a hydrogen atom or a hydrocarbon group which may have a substituent; R', R", R''', R"" and R''''', which may be the same or different, each represents a group selected from the group consisting of a hydroxyl group, and an alkyl, cycloalkyl, alkoxyl, alkenyl, aralkyl and phenyl groups each of which may have a substituent; Y represents an alkyl group, an alkoxyl group or a siloxyl group; $R_0$ represents a group selected from the group consisting of a hydrogen atom, a halogen atom, a substituted or unsubstituted aliphatic hydrocarbon group and a substituted or unsubstituted aromatic hydrocarbon group; l, m, n and q each represents 0 or a positive integer; and p represents a positive integer;
   (b) a compound which generates an acid upon irradiation with actinic rays or radiation, and
   (c) a polymer which has a repeating unit containing a group represented by formula (III), (IV) or (V) at the side chain, and shows the enhanced solubility in an alkaline developing solution by the action or an acid:

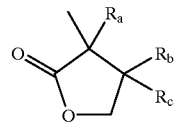

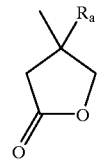

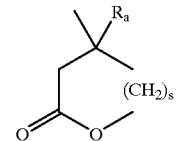

wherein $R_a$, $R_b$ and $R_c$ each represents a hydrogen atom, or a hydrocarbon group which may have a substituent; and s represents an integer of 2 or more.

2. A positive silicone-containing photosensitive composition which comprises:
   (a) a water-insoluble and alkali-soluble polymer having a structure represented by formula (I) and/or (II) as defined in claim 1,
   (b) a compound which generates an acid upon irradiation with actinic rays or radiation, and
   (d) a polymer which has a repeating unit containing a polycyclic structure at the side chain, and shows the enhanced solubility in an alkaline developing solution by the action of an acid.

3. A positive silicone-containing photosensitive composition which comprises:
   (a) a water-insoluble and alkali-soluble polymer having a structure represented by formula (I) and/or (II) as defined in claim 1,
   (b) a compound which generates an acid upon irradiation with actinic rays or radiation, and
   (e) a polymer which has a repeating unit containing a group represented by formula (III), (IV) or (V) as defined in claim 1 at the side chain and a repeating unit containing a polycyclic structure at the side chain, and shows the enhanced solubility in an alkaline developing solution by the action of an acid.

* * * * *